United States Patent [19]

Sakata et al.

[11] Patent Number: 5,333,216
[45] Date of Patent: Jul. 26, 1994

[54] OPTICAL DEVICE USED WAVELENGTH SELECTIVE PHOTOCOUPLER

[75] Inventors: Hajime Sakata, Hiratsuka; Hitoshi Oda, Sagamihara, both of Japan

[73] Assignee: Canon Kabushiki Kaisha, Tokyo, Japan

[21] Appl. No.: 120,234

[22] Filed: Sep. 14, 1993

Related U.S. Application Data

[63] Continuation of Ser. No. 621,990, Dec. 4, 1990, abandoned.

[30] Foreign Application Priority Data

Dec. 4, 1989 [JP] Japan ................................ 1-314841
Feb. 26, 1990 [JP] Japan ................................ 2-45084

[51] Int. Cl.⁵ .......................... G02B 6/00; G02B 6/36
[52] U.S. Cl. ...................................... 385/28; 385/131
[58] Field of Search ................. 385/27, 28, 37, 129, 385/130, 131

[56] References Cited

U.S. PATENT DOCUMENTS 5,101,469  3/1992  Oda .................................... 385/131

FOREIGN PATENT DOCUMENTS 0187979  7/1986  European Pat. Off. .
61-025607  2/1986  Japan .
1-107214  4/1989  Japan .

OTHER PUBLICATIONS

"Grating Assisted InGaAsp/InP Vertical Co-Directional Coupler Filter" by Alferness et al, Technical Digest Series vol. 4, pp. 215–218 (1989).
"Tunable Optical Waveguide Directional Coupler Filter," by R. C. Alferness et al., Applied Physics Letters, vol. 33, No. 2, pp. 161–163 (Jul. 15, 1978).
"Filter Characteristics of Codirectionally Coupled Waveguides with Weighted Coupling," by R. C. Alferness et al., IEEE Journal of Quantum Electronics, vol. QE-14, No. 11, pp. 843–847 (Nov. 1978).
Journal of Lightwave Technology, vol. LT-5, No. 2, Feb., 1987, New York, N.Y., USA, pp. 268–273.
Optical Engineering, vol. 19, No. 4, Aug., 1980, Bellingham, U.S., pp. 581–586.

*Primary Examiner*—Akm E. Ullah
*Attorney, Agent, or Firm*—Fitzpatrick, Cella, Harper & Scinto

[57] ABSTRACT

An optical device comprises a substrate, a first guiding layer having a guided mode provided on the substrate, a second guiding layer laminated with the first guiding layer on the substrate, the second guiding layer having a guided mode different from that of the first guiding layer, and a diffraction grating provided on an area where the first and second guiding layers have their guided modes overlapping, the diffraction grating serving to couple the light on the specific range of wavelengths that propagate through the first guiding layer, with the second layer, wherein the diffraction grating comprises a high refractive index region and a low refractive index region disposed periodically in the propagation direction of light, the ratio of the high refractive index region to the low refractive index region occupied in one period changing gradually in the propagation direction of light.

40 Claims, 19 Drawing Sheets

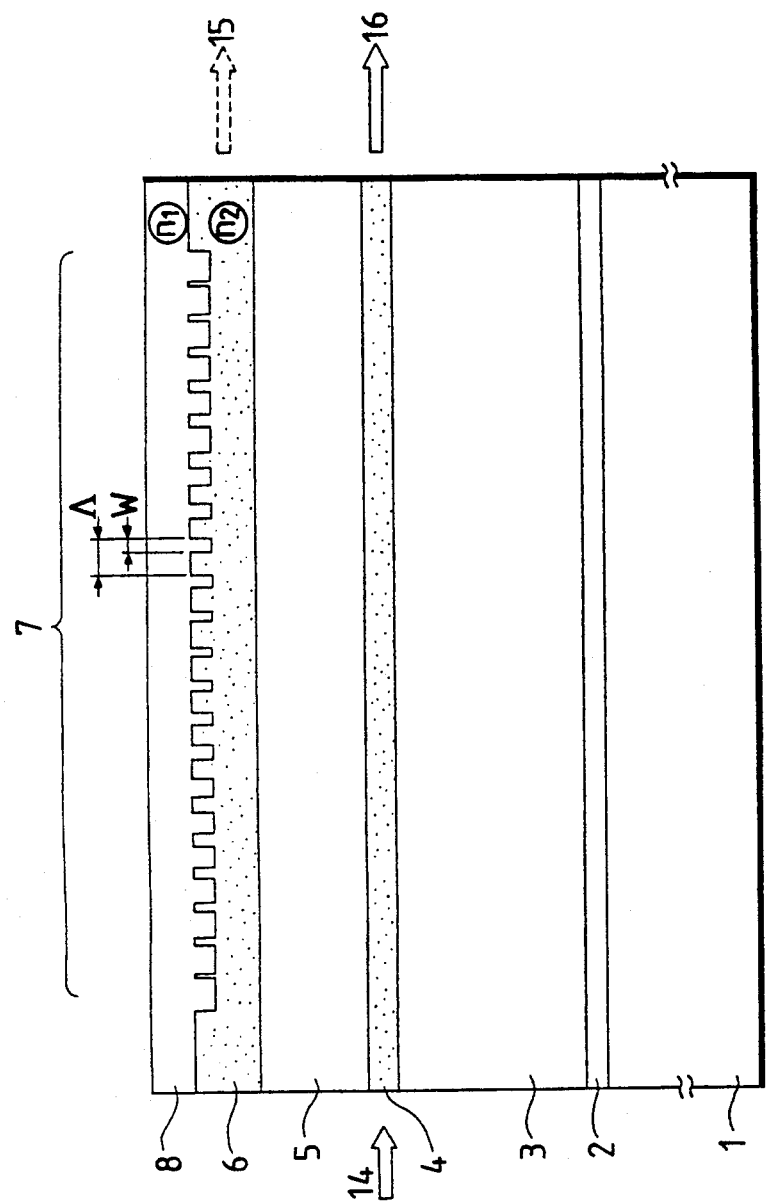

OPTICAL DEVICE USED WAVELENGTH SELECTIVE PHOTOCOUPLER

This application is a continuation of application Ser. No. 07/621,990 filed Dec. 4, 1990, now abandoned.

BACKGROUND OF THE INVENTION

1. Field of the Invention

The present invention relates to an optical device such as an optical filter, photodetector, semiconductor laser, or optic amplifier, using a wavelength selective photocoupler comprising two waveguides coupled by a diffraction grating.

2. Related Background Art

A conventional wavelength selective photocoupler consisted of two optical waveguides formed on the same substrate, as described in R. C. Alferness et al.: Applied Physics Letters, 33, P161 (1978), Japanese Laid-Open Patent Application No. 61-250607, or Miki et al., Electronic Communications Institute study report OQE81-129, for example.

FIG. 1 shows the construction of such a conventional wavelength selective photocoupler. In the same figure, two waveguides 191, 192 are formed with line widths or heights $W_1$, $W_2$, and refractive indexes $n_1$, $n_2$, which are different from each other, as shown. Thus, they have also different distribution relations between the wavelength of guided light propagating through the respective optical waveguides 191, 192 and the propagation constant. The propagation constants of the two waveguides coincide for guided light on a specific range of wavelength, and the optical coupling takes place between the two waveguides 191, 192. In other words, only the light within the specific range of wavelength is selected, and the optical power can be transferred between the waveguides 191, 192.

Such a photocoupler has been used for an optical filter which performs the multiplexing or demultiplexing of waves between the signal light and the light of specific wavelength by using the transfer of this optical power.

However, the optical filter as above mentioned had the spectral transmissivity characteristic containing the non-negligible side lobe on both sides of the transmission band (main lobe) including a central wavelength, as shown in FIG. 2. The existence of the side lobe brought about the cross talk of optical signals when this optical filter was used in the optical communication system using the wavelength division multiplexing method. If there is provided a sufficient separation of wavelengths to avoid the cross talk, the number of communication channels is decreased. The side lobe of the filtering characteristic on such a photocoupler was a factor in preventing the enhancement of performance on an optical device using this photocoupler.

A method for suppressing the side lobe as above mentioned, in which an interval between waveguides 193, 194 constituting the photocoupler is gradually changed as shown in FIG. 3, was proposed in R. C. Alferness et al.: IEEE Journal of Quantum Electronics, QE-14, No. 11, p. 843 (1978).

However, this method had a disadvantage that it was difficult to form the waveguide 193 curvilinearly, and further difficult to manufacture the photocoupler of a type of laminating waveguides in the direction of thickness.

A photocoupler having a sharp wavelength selectively and little loss of quantity of light was proposed in R. C. Alferness et al., "Grating Assisted in GaAsP/INP vertical co-directing coupler filter" 1989 technical digest series vol. 4, pp 215–218. This photocoupler had two guiding layers with different guided modes from each other laminated on a substrate and coupled optically by a diffraction grating. The present inventor has proposed an optical device using this photocoupler in U.S. Ser. No. 491,203 filed on Mar. 9, 1990.

SUMMARY OF THE INVENTION

An object of this invention is to provide an optical device which operates more efficiently by further improving the above mentioned wavelength selective photocoupler using a diffraction grating, and suppressing the side lobe of the filtering characteristic.

The above object can be accomplished by an optical device comprising:

a substrate;

a first guiding layer provided on said substrate;

a second guiding layer laminated with said first layer on said substrate, said second guiding layer having a guided mode difference from that of said first layer; and a diffraction grating provided on a region where said first and second guiding layers have their guided modes overlapping, said diffraction grating serving to couple the light within the specific range of wavelength that propagates through said first layer with said second layer, wherein said diffraction grating comprising high refractive index regions and low refractive index regions disposed periodically in the propagation direction of light, the ratio of the high refractive index regions to the low refractive index regions changing gradually in the propagation direction of light.

BRIEF DESCRIPTION OF THE DRAWINGS

FIG. 4 is a schematic cross-sectional view showing view showing the first example of an optical device according to this invention.

DESCRIPTION OF THE PREFERRED EMBODIMENTS

Figure 1:
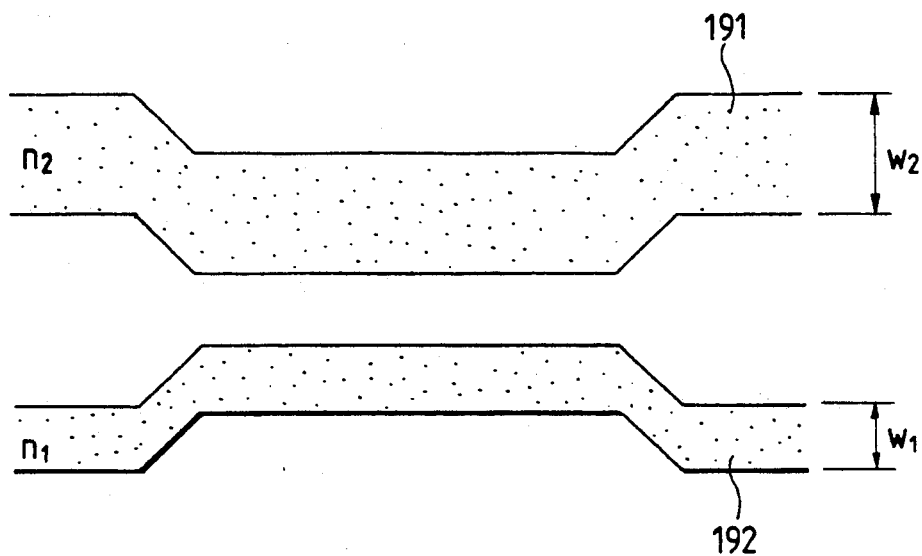
FIG. 1 is a schematic view showing the first example of a conventional wavelength selective photocoupler.
Figure 2:
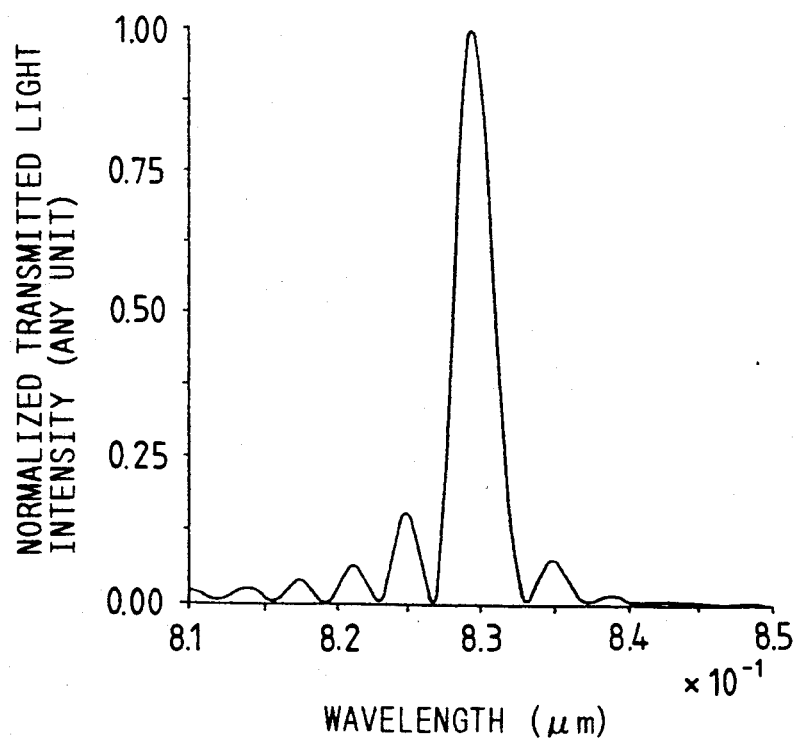
FIG. 2 is a view showing the spectral transmissivity characteristic of an optical filter using the example of FIG. 1.

Referring now to FIG. 4, the construction of the first example according to this invention is depicted. The present example has grown in sequence, with the molecular beam epitaxy (MBE), on a substrate 1 of GaAs, a buffer layer 2 of GaAs, 0.5 $\mu$m thick, a cladding layer 3 of $Al_{0.5}Ga_{0.5}As$, 1.5 $\mu$m thick, a first waveguide 4, 0.1 $\mu$m thick, which is made a multiple quantum well (MQW) by laminating GaAs and $Al_{0.4}Ga_{0.6}As$, alternately, a cladding layer 5 of $Al_{0.5}Ga_{0.5}As$, 0.8 $\mu$m thick, and a second layer 6, 0.4 $\mu$m thick, which is made a MQW by laminating GaAs and $Al_{0.2}Ga_{0.8}As$, alternately. Then, after making a resist mask with the photolithography method using a photoresist, a grating 7 consisting of corrugation 0.07 $\mu$m in depth is formed in portions on an upper surface of the second waveguide 6 with reactive ion beam etching (RIBE).

In this example, in order to suppress the side lobe of the filter spectrum, the coupling coefficient of the grating 7 is changed almost symmetrically along the traveling direction of light from its central portion toward the incident and propagation sides of the light. In other words, the pattern of the grating 7 is changed, as shown in FIG. 4, by making the pitch $\Lambda$ constant and changing the proportion of ridge to groove (or line to space) constituting the grating 7 along the progressive direction of light. The ridge is a portion of high refractive index $n_2$, while the groove is a portion of low refractive index $n_1$.

After forming the grating 7, the $SiO_2$ layer 8 is coated on the grating 7 with the sputtering method. Then after applying a photoresist again, and making a pattern of stripe extending in the propagation direction of light for laterally confining the guided light, a wafer is etched with the RIBE method, to a position where the GaAs substrate 1 is exposed, in which a leading edge of stripe is cut obliquely to the progressive direction of light to couple the light to only the first waveguide 4 when the light enters.

Then $Al_{0.5}Ga_{0.5}As$ is grown, with the liquid phase epitaxy (LPE) method, to endbed the stripe, and $SiO_2$ is coated again over the entire surface. Consequently, the structure with two waveguides 4, 6 laminated as shown in FIG. 4 can be obtained.

In this way, the optical wavelength filter of this example has two layers of waveguides (first waveguide 4, second waveguide 6) laminated in the layer direction, thereby constituting a directional coupler. As each waveguide 4, 6 is formed to have a different thickness or composition, it has a different propagation constant for light propagating through it. The grating 7 formed on the second waveguide 6 is used to select a wavelength to be coupled optically. The wavelength can be selected by changing the pitch or the ratio of ridge to groove.

Figure 5:
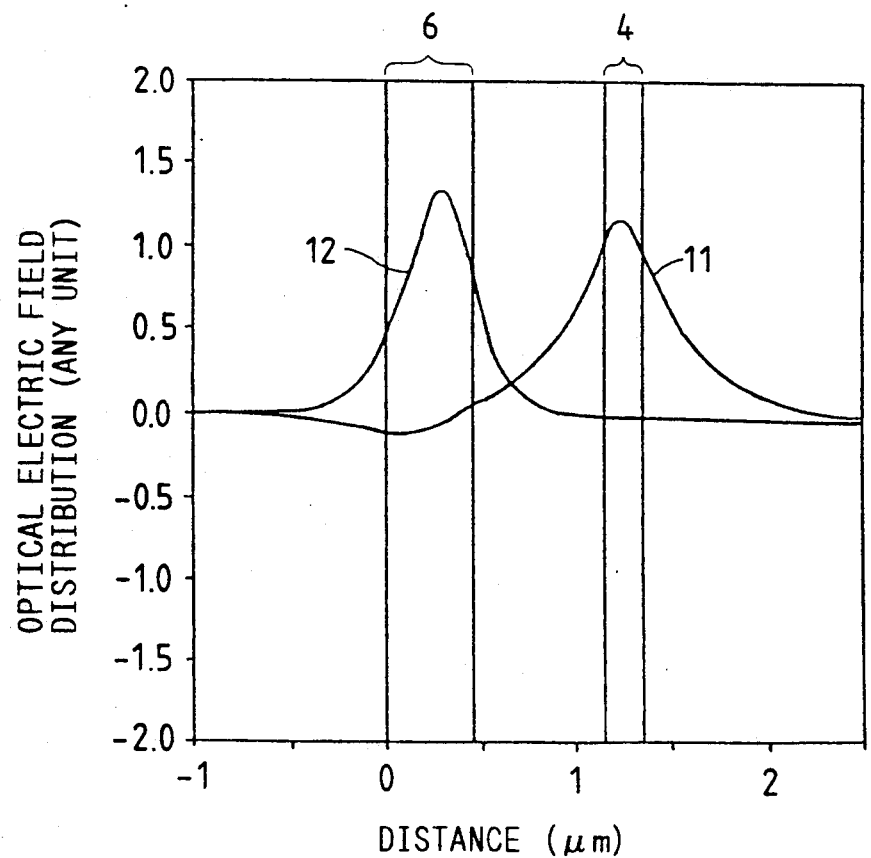
FIG. 5 is a view showing the optical electric field distribution for each guided mode in the first example.

FIG. 5 shows the optical electric field distribution in the guided modes of this example. The longitudinal axis is an optical electric field intensity distribution, while the transversal axis is a distance in the lamination direction with reference to an upper surface of the second waveguide 6. Thus, there are two guided modes in the waveguides 4, 6 of this example, i.e., the odd mode 11 which stands on the first waveguide 4 as the central portion, and the even mode 12 which stands on the second waveguide 6 as the central portion. The grating 7 is formed in an overlapping portion (left portion of the second waveguide 6 in FIG. 5) of the odd mode 11 and the even mode 12, as above described.

The operation of this example will be described.

The incident light 14 multiplexed in wavelengths ranging from 0.80 $\mu$m to 0.86 $\mu$m is coupled for input to the first waveguide 4, as shown in FIG. 4. There are two guided modes which stand in two waveguides 4, 6, i.e., the even mode 12 and the odd mode 11, as previously described. The incident light 14 input to the first waveguide 4 propagates in the odd mode 11 that stands on the first waveguide 4 as the central portion. As the odd mode 11 and the even mode 12 have different propagation constants, the light propagates nearly independently almost without coupling at the area where the grating 7 does not exist. However, at the area where the grating 7 exists, the transfer of optic power occurs if the following relation exists between the propagation constant $\beta_{odd}$ for the odd mode 11 and the propagation constant $\beta_{even}$ for the even mode 12.

$$\beta_{even}(\lambda) - \beta_{odd}(\lambda) = 2\pi/\Lambda \qquad (1)$$

Where $\lambda$ is the wavelength of light, and $\Lambda$ is the pitch of grating 7.

If the transfer of optic power occurs as described above, the guided light in the odd mode 11 to which the incident light 14 is coupled can be converted into the guided light in the even mode 12. Accordingly, the incident light 14 ultimately becomes the optical wave propagating through the second waveguide 6, and is output as the selected output light 15. The light with other wavelengths is output from the first waveguide 4 as the unselected output light 16.

Figure 6:
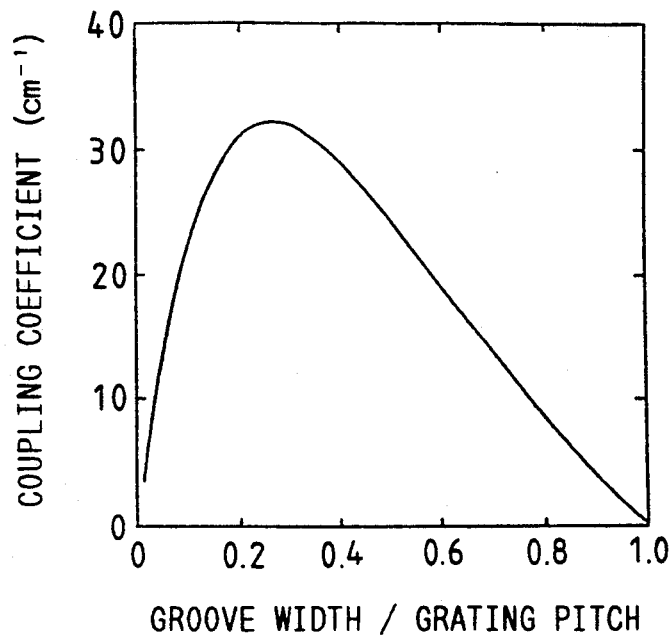
FIG. 6 is a view showing a relation between the groove width/grating pitch and the coupling coefficient.

Also, a coupling coefficient g is provided, which is a coefficient expressing the coupling intensity of optical waves propagating the two waveguides 4, 6. The coupling coefficient g is given by the following expression.

$$g = \int \epsilon_{even}(x) \cdot A_1(x) \cdot \epsilon_{odd}(x) dx \qquad (2)$$

Where $\epsilon_{even}$, $\epsilon_{odd}$ is the optical electric field distribution in the even or odd mode, respectively, and $A_1$ is a component of Fourier series corresponding to the primary diffracted light for the grating 7. Assuming that the ridge and groove of the grating 7 is rectangular, $A_1(x)$ is given by the following expression:

$$A_1(x) = \frac{-(n_2^2 - n_1^2)}{\pi q} \cdot \sin(\pi q \cdot w/\Lambda) \quad \text{for } 0 < x < w$$
$$= 0 \quad \text{for } x < 0 \text{ or } w < x$$

where q=1 as the coupling of $\beta_{even}$ and $\beta_{odd}$ is performed by the primary diffracted light, $n_1$ and $n_2$ are refractive indices of materials constituting the ridge and groove of the grating 7, respectively, $\Lambda$ is a pitch of the grating 7, and w is a groove width. In other words, the coupling coefficient g depends on the ratio of ridge to groove occupied in the pitch $\Lambda$ of the grating 7. FIG. 6 is a graph representing the change of the coupling coefficient g when the ratio of ridge to groove in the grating 7 is changed in a directional coupler type optical filter in accordance with the configuration of this example. In the example as shown, the intensity of coupling is at maximum near the position where the ratio of ridge to groove is 0.75:0.25, and decreases below or beyond that position. However, the ratio of ridge to groove at which the intensity of coupling is at maximum depends on the configuration of waveguide.

Figure 3:
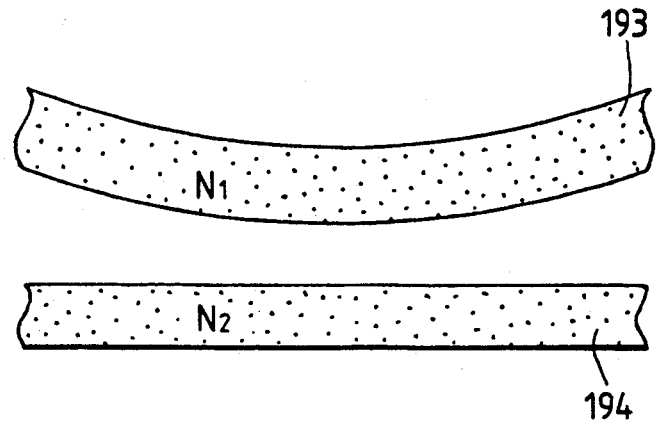
FIG. 3 is a schematic view showing the second example of a conventional wavelength selective photocoupler.

Thus, in this example, in order to perform the wavelength filtering with the light having a central wavelength of 0.83 μm, the pitch $\Lambda$ is set to be 7.8 μm according to the expression (1), and the ratio of ridge to groove constituting the grating 7 is configured as shown in FIG. 4. In other words, the ratio of ridge to groove is 0.7:0.3 in the center of the grating area with the groove gradually increasing in proportion toward the periphery, and the ratio is 0.1:0.9 at both ends. In this way, the coupling coefficient or the intensity of coupling is changed in the same way as in the conventional example as shown in FIG. 3, by gradually changing the ratio of ridge to groove form the center of grating toward the periphery.

Here, the length of coupling or the complete coupling length is defined to exemplify the distribution for the intensity of coupling. Assuming that the progressive direction of guided light is the z direction, the complete coupling length is L, and the coupling coefficient which changes in the z direction is G(z), the following expression is satisfied:

$$\int_{-L/2}^{L/2} G(z) dz = \pi/2$$

where the function for distribution G(z) is referred to as a Taper function, which is set to be F(z), and the following expression is obtained:

$$G(z) = G_0 \cdot F(z) \qquad (5)$$

($G_0$ is a constant)
Note that F(z) is normalized with L, i.e., the following expression is satisfied:

$$\int_{-L/2}^{L/2} F(z) dz = L$$

From the expressions (4), (5) and (6), the complete coupling length L can be obtained as in the following:

$$G_0 L = \pi/2$$
$$\therefore L = \pi/2G_0$$

Figure 7:
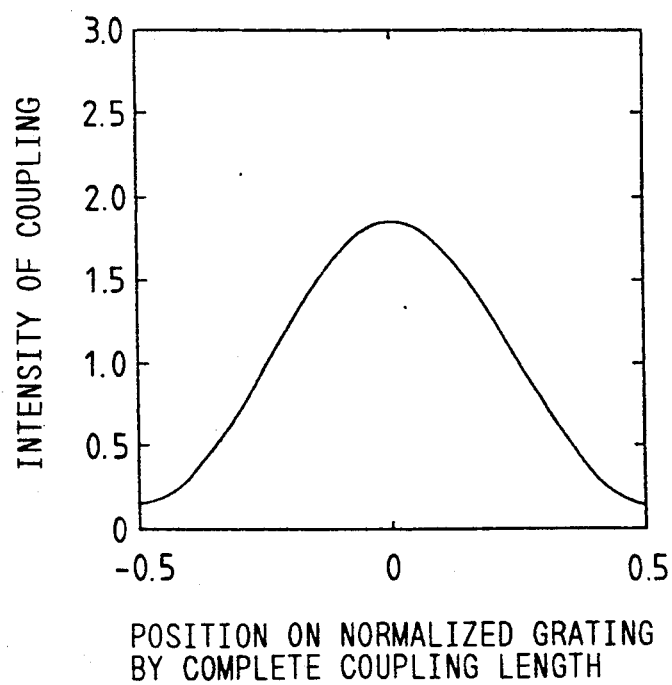
FIG. 7 is a view showing a spatial change of the coupling coefficient for the grating in the first example.

As $G_O$ is 21.5 cm$^{-1}$ in this example, the coupling length L is 730 (μm). Thus it is assumed in this example that the coupling length L is 730 μm, and the Taper function F(z) for representing the distribution of the intensity of coupling is a Hamming function as shown in FIG. 7. This Hamming function is expressed as in the following:

$$F(z) = 1 + 0.852 \cdot \cos(2\pi z/L)$$

Figure 8:
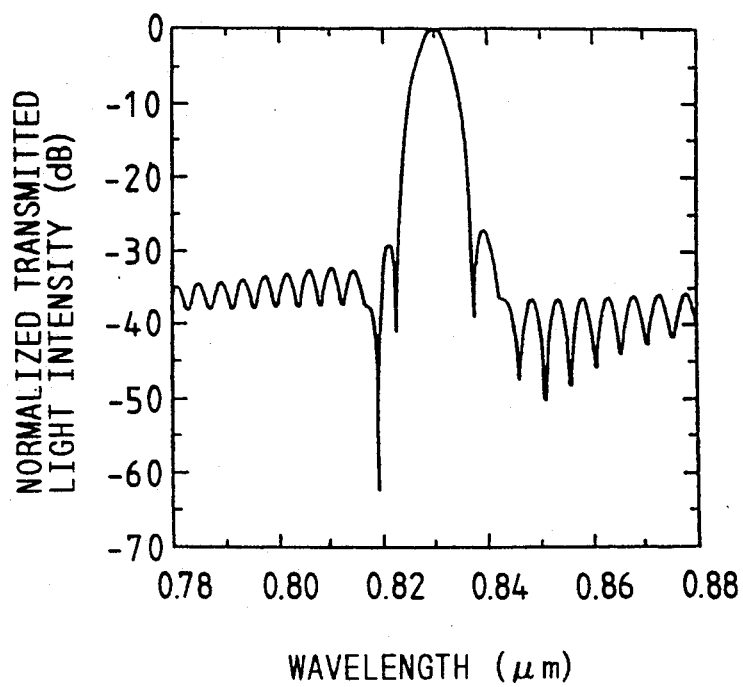
FIG. 8 is a view showing the filter spectrum in the first example.
Figure 9:
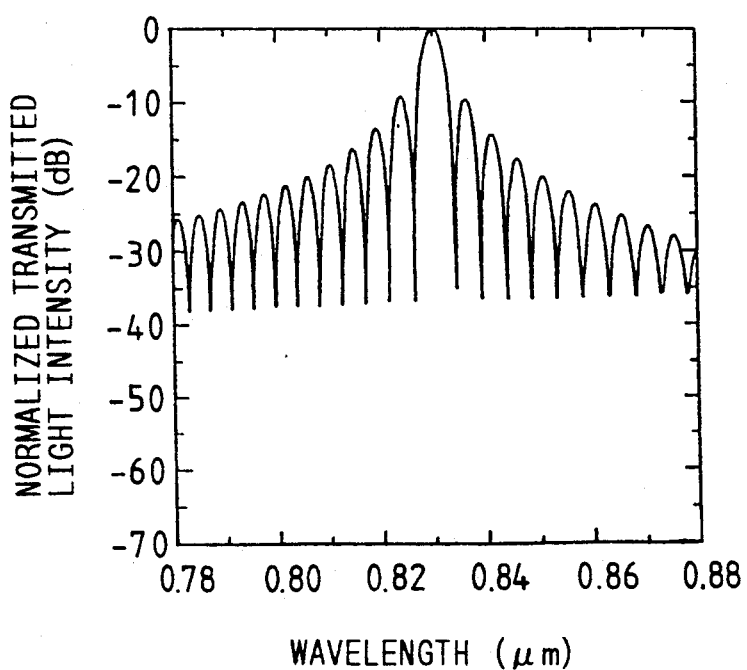
FIG. 9 is a view showing the filter spectrum of a conventional diffraction grating.

With the above configuration, the intensity (filter spectrum) of selected output light 15 to be output from the second waveguide 6 among the light 14 incident upon the first waveguide 4 is as shown in FIG. 8. For comparison, the spectrum of one example is shown in FIG. 9, in which the ratio of ridge to groove of the grating is constant, and the intensity of coupling is made constant over the whole area where the grating is formed. With the comparison between FIG. 8 and FIG. 9, it should be clear that the suppression effect of side lobes can be sufficiently obtained with the configuration of this example. From the filter spectrum as shown in FIG. 8, it will be seen that the full width at half maximum is 55Å and the ratio of the transmitted light intensity on the central wavelength of main lobe to that on the wavelength 100Å off that central wavelength is about 30 dB. In the configuration of FIG. 4, it should be noted that an unreflective coating of $ZrO_2$ is applied on the input and output end faces to suppress the decrease of efficiency and the occurrence of ripples accompanied by the reflection upon the end faces.

Figure 10:
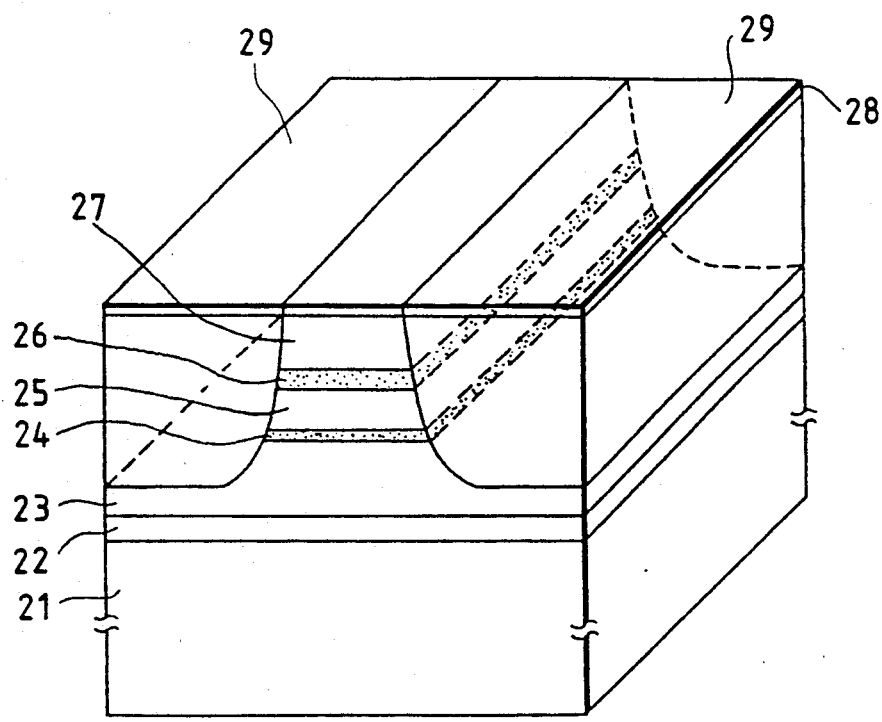
FIG. 10 is a schematic perspective view showing the second example of an optical device according to this invention.

FIG. 10 shows a second example. The second example, in the same way as the first example, has grown in sequence with the molecular beam epitaxy (MBE), on a GaAs substrate 21, a buffer layer 22 of GaAs, 0.5 μm thick, a cladding layer 23 of $Al_{0.5}Ga_{0.5}As$, 1.5 μm thick, a first guiding layer 24, 0.15 μm thick, which is made a multiple quantum well (MQW) by laminating GaAs and $Al_{0.4}Ga_{0.6}As$, alternately, a cladding layer 25 of $Al_{0.5}Ga_{0.5}As$, 0.9 μm thick, and a guiding layer 26, 0.5 μm thick, which is made a MQW by laminating GaAs and $Al_{0.2}Ga_{0.8}As$, alternately. Then with the photoresist and RIBE method, the grating (not shown) consisting of corrugation 0.3 μm deep is formed on the second guiding layer 26, and then with the LPE method, the layer of $Al_{0.5}Ga_{0.5}As$ is regrown to embed the groove of the grating. Subsequently, the GaAs layer is grown as a cap layer 28, and after forming the stripe with $SiO_2$, impurities such as Zn (or Si) are placed on both sides of the stripe, with thermal diffusion, to confine the light in the transverse direction. Thereby the first guiding layer 24 and the second guiding layer 26 have both of their sides disordered, where a region 29 with a low refractive index is formed, so that the optical wavelength filter as shown in FIG. 10 is made.

With the low refractive index region 29 formed on both sides of the first guiding layer 24 and the second guiding layer 26, the guided light is confined in the transverse direction to reduce the loss due to diffraction spreading of the guided light, which results in a highly efficient optical wavelength filter.

The confinement in the transverse direction can be accomplished in various ways, such as a method of forming ridges or a loading method, besides the method as described in the first and second examples.

In the second example, the ratio of ridge (high refractive index region) to groove (low refractive index region) constituting the grating is changed from 0.6:0.4 to 1.0 from the center to the periphery to increase the ratio of ridge to groove.

Figure 11:
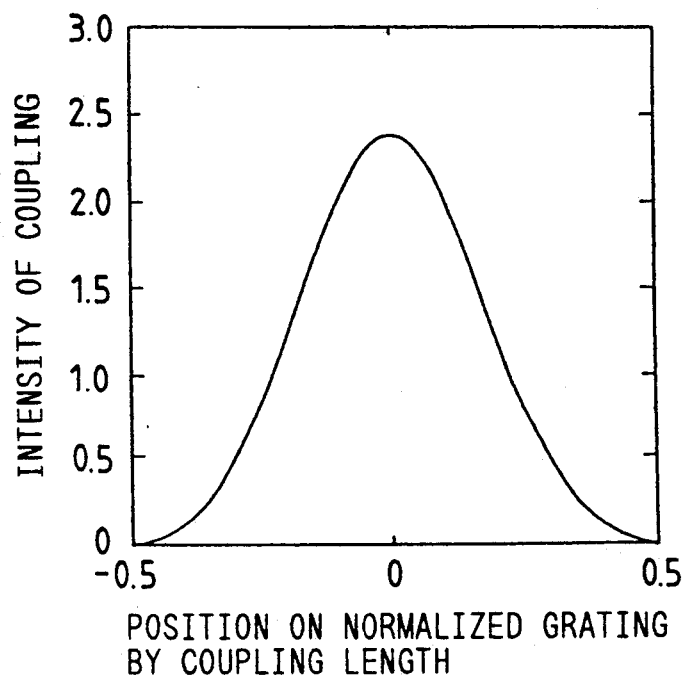
FIG. 11 is a view showing a spatial change of the coupling coefficient for the grating in the second example.

With this configuration, the change of the coupling coefficient on the grating area follows the shape of a Blackman function, as shown in FIG. 11. The Blackman function F(z) is expressed as follows:

$$F(z) = 1 + 1.19 \cos(2\pi z/L) + 0.19 \cos(4\pi z/L)$$

Figure 12:
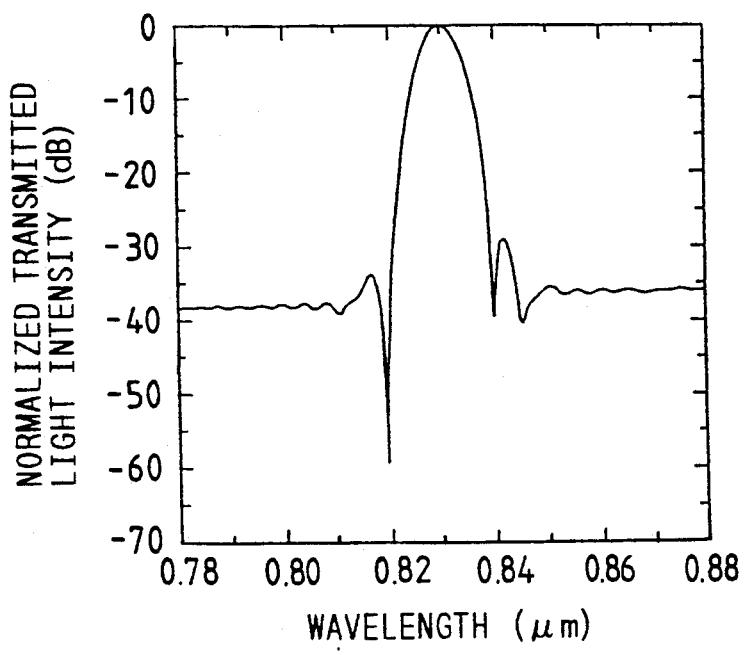
FIG. 12 is a view showing the filter spectrum in the second example.

From the filter spectrum of the second example as shown in FIG. 12, it is seen how the side lobe is suppressed. The full width of half maximum is 73Å, and the ratio of the transmittivity on the central wavelength the main lobe to that on the wavelength 100Å off that central wavelength is from 30 dB to 35 dB or more.

Further, besides the Taper function for the coupling coefficient in the first and second examples, the following distribution is provided. That is the coupling coefficient can be given in the propagation direction of light by the raised cosine function, $$F(z) = 1 + \cos(2\pi z/L) \quad (7)$$

or the Kaiser function $$F(z) = [\gamma/\sinh(\gamma)]I_0(\gamma\{1 - (2z/L)^2\}^{\frac{1}{2}}) \quad (8)$$

where L is the complete coupling length, z is a position along the waveguide in $-L/2 \leq z \leq L/2$, $\gamma$ is an arbitrary number, and $I_0$ is the zero order value of the Bessel function of the first kind. The side lobe can be suppressed if the grating with a distribution in accordance with the above function is formed.

In the above examples, the grating is formed on the second waveguide 6, 26, but the grating may be made at any portions where the optical electric field distributions (even mode 12, odd mode 11) of the guided light both exist. However, since the coupling coefficient changes with the coupling length L, the coupling length L must be correspondingly adjusted.

Each of the above examples was constructed from GaAs/AlGaAs materials, but it is clear that they can be constructed from other materials, such as semiconductor compounds of InGaAs/InGaP, glass materials of $SiO_2/TiO_2$, or optical crystals of $LiNbO_3$, $LiTaO_3$, and BSO.

Figure 13:
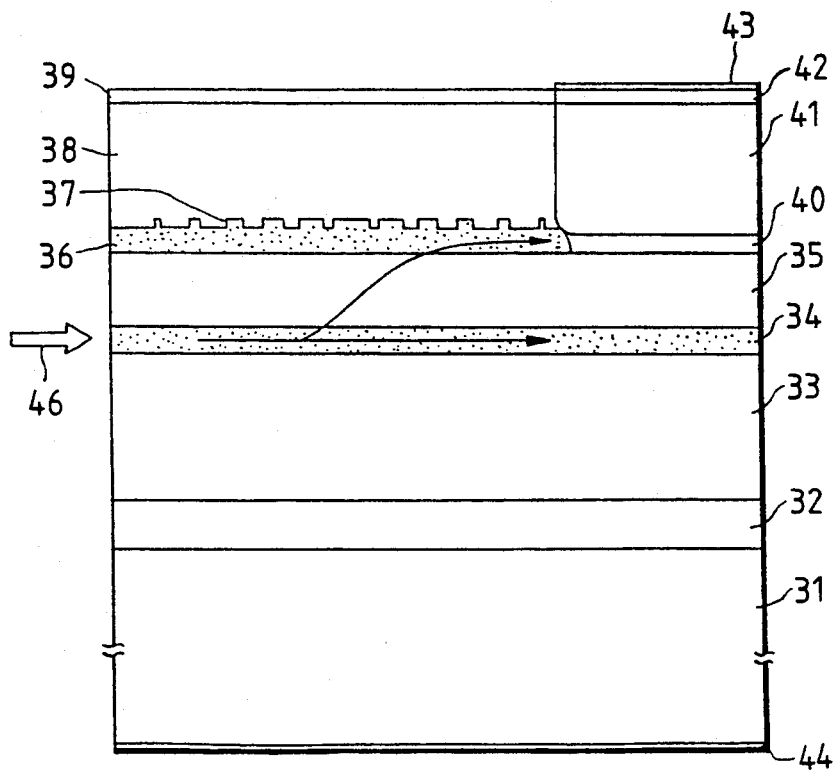
FIG. 13 is a cross-sectional side view showing the third example of an optical device according to this invention.

FIG. 13 shows the third example according to this invention. This example was embodied by integrating photodetectors having wavelength selectiveness, with the construction of an optical wavelength filter as previously described.

The third example has grown in sequence with the molecular beam epitaxy (MBE), on a substrate 31 of $N^+$-GaAs, a buffer layer 32 of n-GaAs, 0.5 μm thick, a cladding layer 33 of n-$Al_{0.5}Ga_{0.5}As$, 1.5 μm thick, a first guiding 34 of n-$Al_{0.3}Ga_{0.7}As$, 0.2 μm thick, a cladding layer 35 of n-$Al_{0.5}Ga_{0.5}As$, 0.8 μm thick, and a second layer 36, 0.4 μm thick, which is made a MQW by laminating i-GaAs and i-$Al_{0.4}Ga_{0.6}As$, alternately. Then with the photolithography method, the grating of corrugation, 0.05 μm in depth and 7.7 μm in pitch with the ratio of ridge to groove changing in the traveling direction of light in accordance with the Kaiser function (expression (8) as shown above), was formed on an upper surface of the second guiding layer 36 over the length 1.277 mm.

Then with the liquid phase epitaxy (LPE) method, a cladding layer 38 of i-$Al_{0.5}Ga_{0.5}As$, and a cap layer 39 of i-GaAs, 0.5 μm thick, are regrown on that surface. Thereafter, the cladding layer 38 and the second layer 36 in the region adjacent to the grating 37 are removed by etching. Further, with the LPE method, an absorption layer of i-GaAs, 0.1 μm thick, a cladding layer 41 of p-$Al_{0.5}Ga_{0.5}As$, 1.2 μm thick, and a cap layer of $p^+$-GaAs, 0.5 μm thick are regrown on that removed area, and subsequently, an electrode 43 consisting of Cr/Au is formed on the cap layer 42, and an electrode 44 consisting of AuGe/Au is formed on the back surface of the substrate 31.

In this example, only the light having the wavelength selected by the optical wavelength filter from the light 46 incident upon the first guiding layer 34 is coupled to the second guiding layer 36, and absorbed in the absorption layer 40 which is a photodetection portion. The photodetection portion has a p-i-n structure, and a reverse bias is applied between electrodes 43, 44. Therefore, carriers caused by the absorption are detected as the electric current signal.

Figure 14:
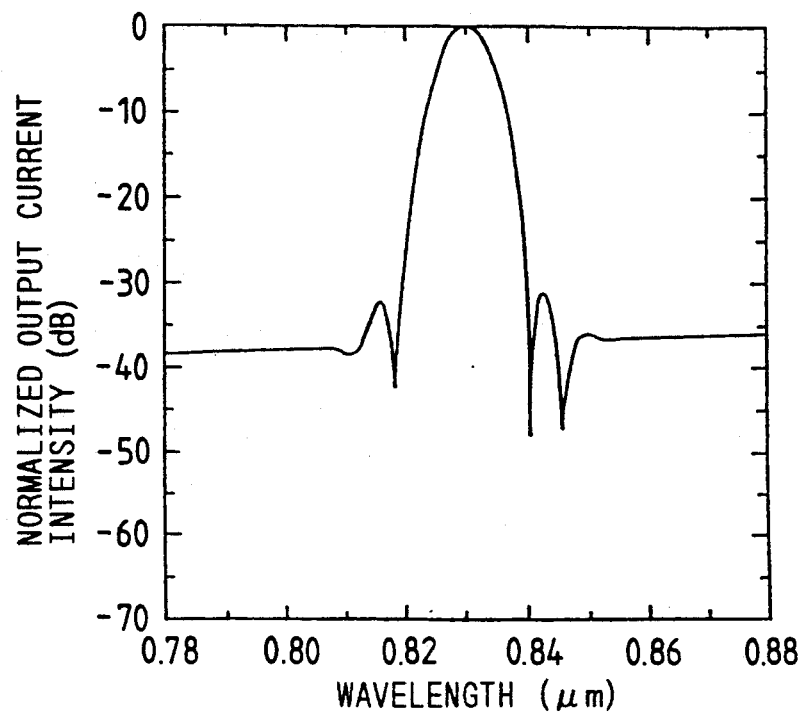
FIG. 14 is a view showing the wavelength characteristic of electric signal detected in the third example.

FIG. 14 is a view showing the wavelength characteristic of signal light to be taken out as electric signals in this example. The full width of half maximum, i.e., the bandwidth of the −3 dB which is a wavelength selective characteristic, is about 78Å. The ratio of output current at the central wavelength of the main lobe to that of the wavelength 100Å off that central wavelength (or cross talk between wavelengths) is about 30 dB, which indicates that the side lobe is sufficiently suppressed.

Figure 15:
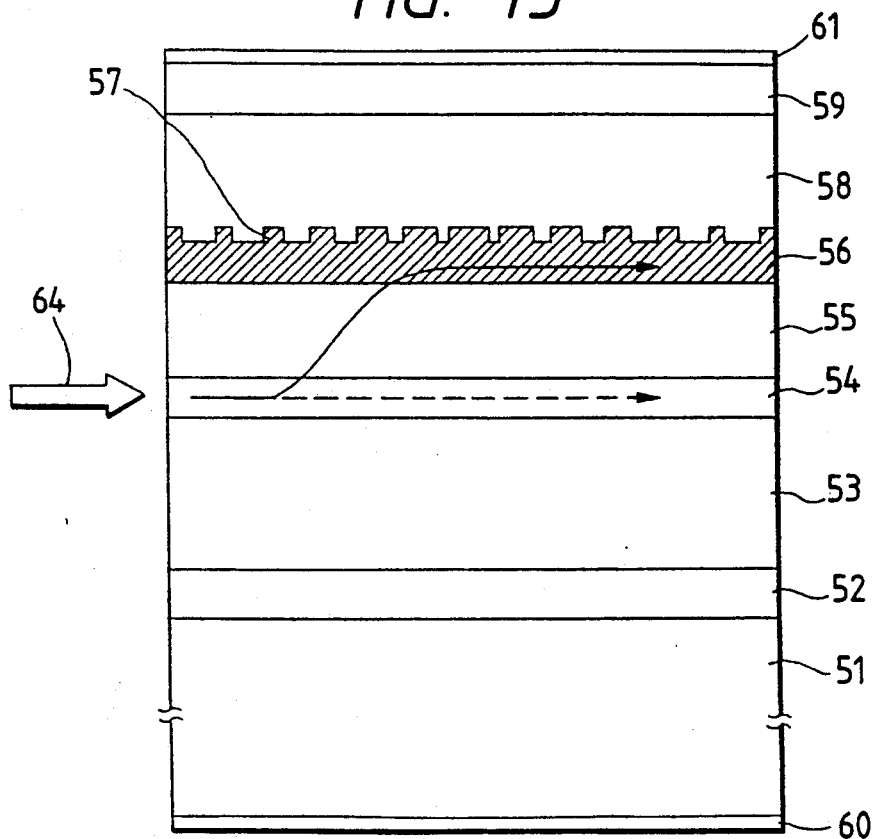
FIG. 15 is a cross-sectional side view showing the fourth example of an optical device according to this invention.

FIG. 15 is a view showing the construction of the fourth example according to this invention. This fourth example has grown in sequence on the substrate 51 of n+-GaAs, with the molecular beam epitaxy (MBE), a buffer layer 52 of n-GaAs, 0.5 μm thick, a cladding layer 53 of n-Al$_{0.5}$Ga$_{0.5}$As, 1.5 μm thick, a guiding layer 54, 0.2 μm thick, which is made a multiple quantum well (MQW) by laminating n-GaAs, 30Å thick, and Al$_{0.5}$Ga$_{0.5}$As, 70Å thick, alternately, a cladding layer 55 of n-Al$_{0.5}$Ga$_{0.5}$As, 0.7 μm thick, and a light absorption layer 56 of i-GaAs, 0.4 μm thick.

Then with the photolithography method using a photoresist, a resist mask is made, an upper surface of the light absorption layer 56 is etched by using ammonia and hydrogen peroxide, and then the grating 57 consisting of corrugation is formed over the length 100 μm, in which the grating has a depth 0.2 μm, a pitch 5.5 μm, and the ratio of ridge to groove of the grating 57 changing in the traveling direction of light in accordance with the raised cosine function as shown above in the expression (7).

Then with the liquid phase epitaxy (LPE) method, a cladding layer 58 consisting of p-Al$_{0.5}$Ga$_{0.5}$As is regrown, and further a cap layer 59 consisting of p+-GaAs is regrown. Finally, a contact layer (not shown) consisting of Au-Ge and an electrode 60 of Au are coated on the back surface of the substrate 51, and a contact layer (not shown) and an electrode 61 of Au are coated on the upper surface of the cap layer 59. In this way, a photodetector which is a p-i-n type photodiode is made. The photodetector of this example is constructed as shown above so that the guiding layer 54 and the light absorption layer 56 laminated in the layer direction form a directional photocoupler. As the guiding layer 54 and the light absorption layer 56 have different compositions and thicknesses of layers, the propagation constants of light propagating through each layer are different. The grating 57 formed on the upper surface of the light absorption layer 56 is used to select the light with which the directional coupling is performed by changing the pitch of grating and the ratio of ridge to groove.

The operation of this example is described as follows. A reverse bias is applied between electrodes 60, 61 of this example, and the signal light 64 which consists of light having wavelengths ranging from 0.78 μm to 0.88 μm at intervals of 0.01 μm enters the guiding layer 54 by the end face coupling. The input signal light 64 propagates in the odd mode 11 having the central intensity on the guiding layer 54, wherein either the even or odd mode 11, 12 stands within the photocoupler as shown in FIG. 5. As the optical electric intensity distribution of this odd mode 11 fails to reach the light absorption layer 56 almost entirely, as shown in FIG. 5, the propagation loss due to the absorption in the absorption layer 56 is quite small.

Figure 16:
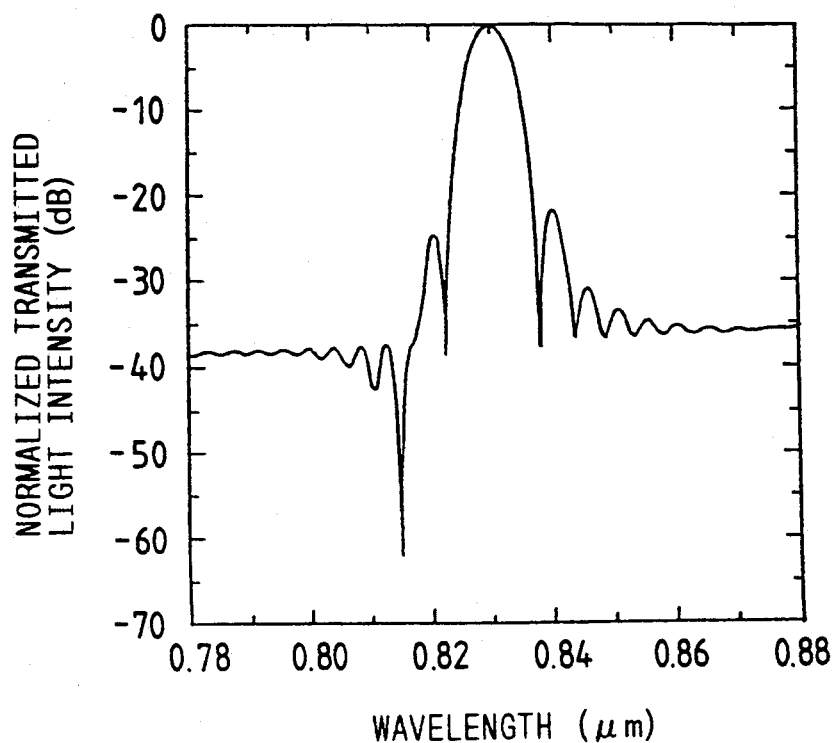
FIG. 16 is a view showing the filter spectrum in the fourth example.

If the relation as expressed in (1) is satisfied for the specific wavelength as above described, the light of the odd mode 11 is converted into that of the even mode 12, and the central intensity transfers to the light absorption layer 56 In this example the grating pitch Λ is 5.5 μm and a wavelength of 0.83 μm is detected. Thus the guided light transferred into the light absorption layer 56 is absorbed, creating electrons and holes, which are detected externally as the photoelectric current. FIG. 16 is a view showing the wavelength distribution of light detected in this example. It will be seen how the sharp selection is performed with the side lobe sufficiently suppressed at the full width at half maximum 64Å.

In this example, the grating 57 is formed over the length 100 μm, which is a length not reaching to the complete coupling length of 262 μm (the length of the coupling area where the coupling efficiency is at maximum) of a directional coupler. This is because the responsibility of the photodetector has been taken into consideration. Therefore, if the responsibility is degraded due to the increased reception area of light, the absorption efficiency of light can be further increased by making the length of the grating area closer to the complete coupling length.

If a plurality of elements of this example are connected in tandem by changing the pitch of grating and the ratio of ridge to groove, an integrated photodetector which allows a simultaneous detection of signal lights having a plurality of wavelengths can also be made.

Figure 17:
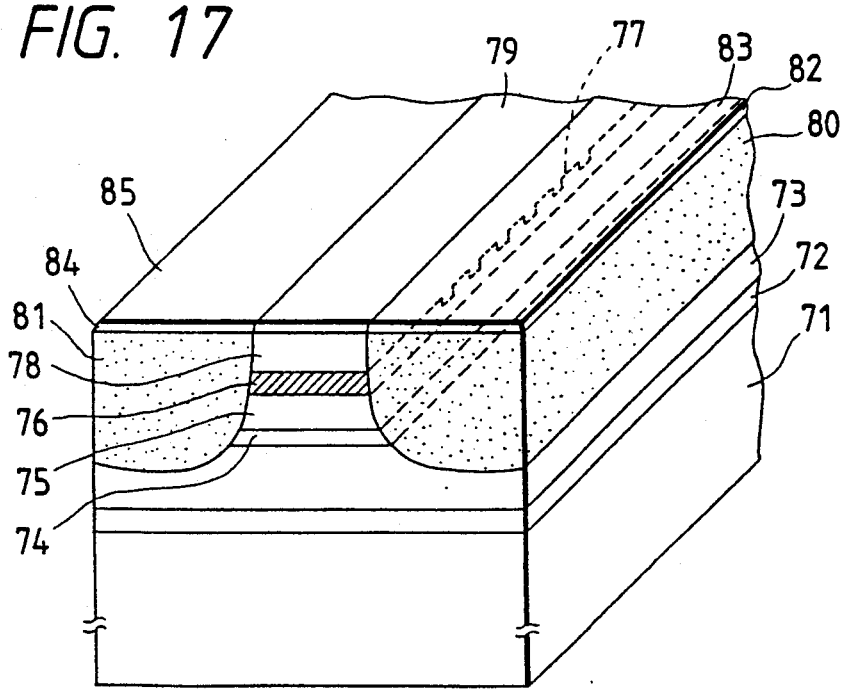
FIG. 17 is a schematic perspective view showing the fifth example of an optical device according to this invention.

FIG. 17 is a view showing the fifth example according to this invention. This example has a horizontal-type p-i-n structure for photodetection.

The structure of this example has in sequence, coated on the substrate 71 of semi-insulating GaAs, a buffer layer 72 of thickness 0.5 μm consisting of i-GaAs, a cladding layer 73 of thickness 1.5 μm consisting of i-Al$_{0.5}$Ga$_{0.5}$As, a guiding layer 74 of thickness 0.2 μm which is made a multiple quantum well (MQW) by laminating a i-GaAs layer of thickness 50Å and a Al$_{0.5}$Ga$_{0.5}$As layer alternately, a cladding layer 75 of thickness 0.75 μm consisting of i-Al$_{0.5}$Ga$_{0.5}$As, and a light absorption layer 76 of thickness 0.3 μm consisting of i-GaAs. Then in the same process as in the fourth example as shown in FIG. 15, the corrugation-like grating 77 of 0.05 μm depth tapered to the intensity of coupling is made on an upper surface of the light absorption layer 76. The pitch of corrugation is 4.6 μm, and the length of the grating area is 200 μm. Thereafter, a cladding layer 78 of thickness 1.5 μm consisting of i-Al$_{0.5}$Ga$_{0.5}$As is grown, and further a protective layer 79 consisting of Si$_3$N$_4$ is coated.

Then, Zn and Si are placed by thermal diffusion on both sides with a 2 μm space on an upper surface of the protective layer 79, and a p-type region 80 and an n-type region 81 are formed. Subsequently, a cap layer 82 consisting of p+-GaAs and an electrode 83 consisting of Cr/Au are created on the upper portion of the p-type area 80, while a cap layer 84 consisting of n+-GaAs and an electrode 85 consisting of Au-Ge/Au are created on an upper portion of the n-type area 81.

A reverse bias is applied to the p-i-n horizontal-type structure thus made, and the wavelength characteristic of detected intensity for the incident light is observed in the same way as in the fourth example. As a result, an excellent wavelength selectivity can be obtained as in the fourth example.

As the structure of this example uses a semi-insulating substrate 71, it is easy to electrically isolate it from other elements, and it is also advantageous for the integration of a plurality of photocouplers, or integration with an amplifier for detection, a light emitting element, or a control driver.

Figure 18:
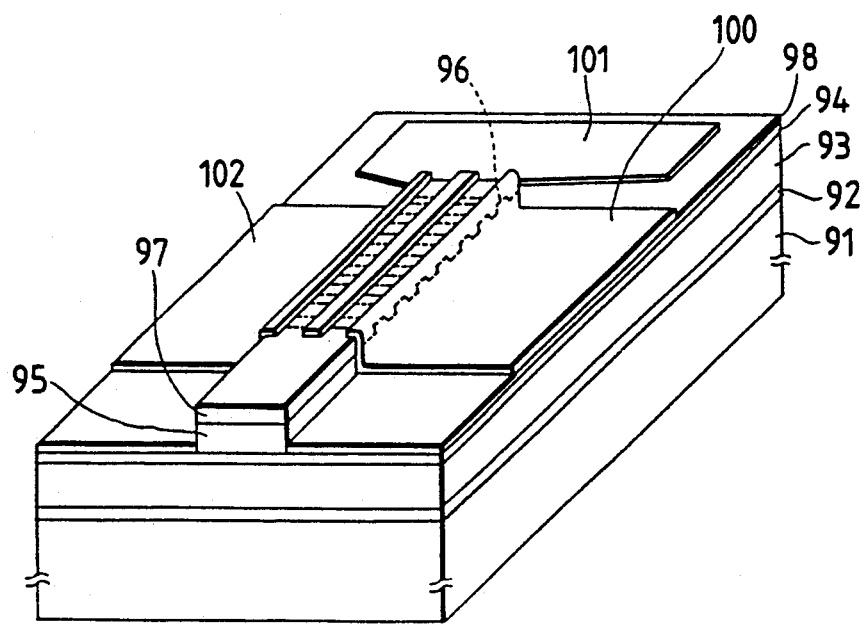
FIG. 18 is a schematic perspective view showing the sixth example of an optical device according to this invention.

FIG. 18 is a view showing the construction of the sixth example according to this invention. This example has an amplifying feature with the FET structure in addition to the wavelength branching detection feature.

In the same way as the fifth example, this example has coated in sequence, with the NBE method, on the substrate 91 of semi-insulating GaAs, a buffer layer 92 of thickness 0.5 μm consisting of i-GaAs, a cladding layer 93 of thickness 1.5 μm consisting of i-Al$_{0.5}$As, a guiding layer 94 of thickness 0.2 μm constructed in the same way as the guiding layer 74 of the fifth example and, a cladding layer 95 of thickness 0.6 μm consisting of i-Al$_{0.5}$As. Then, using the same process as in the fourth example, the corrugation like grating 96 tapered to the intensity of coupling is formed, and subsequently, after the light absorption layer 97 of thickness 0.4 μm consisting of n-GaAs (dopening density—$1 \times 10^{17}$ cm$^{-3}$) is regrown, an insulating layer 98 of thickness 0.3 μm consisting of Si$_3$N$_4$ is coated with the sputtering method.

Then, as shown, a source electrode 100, a gate electrode 101, and a drain electrode 102 are created on the light absorption layer 97 to make the FET structure. The source electrode 100 and the drain electrode 102 are formed from the Au layer having an undercoating layer of Au-Ge, and the gate electrode 101 is formed of Al.

The operation of this example is performed in the same way as previous examples, such that the light incident upon the guiding layer 94 is converted in mode on the grating region 96, and absorbed in the light absorption layer. Carriers resulting from the absorption are amplified and detected as a drain current.

Since this example has an amplifying feature with an FET structure added, in addition to the wavelength detection feature, a photodetector with an excellent detection sensitivity can be obtained.

Also in this example, the layer where the grating 96 is formed may be any region where the guided modes (the even mode 12 and the odd mode 11) that stand on the light absorption layer 97 or the guiding layer 94 as the central portion will overlap.

Figure 19:
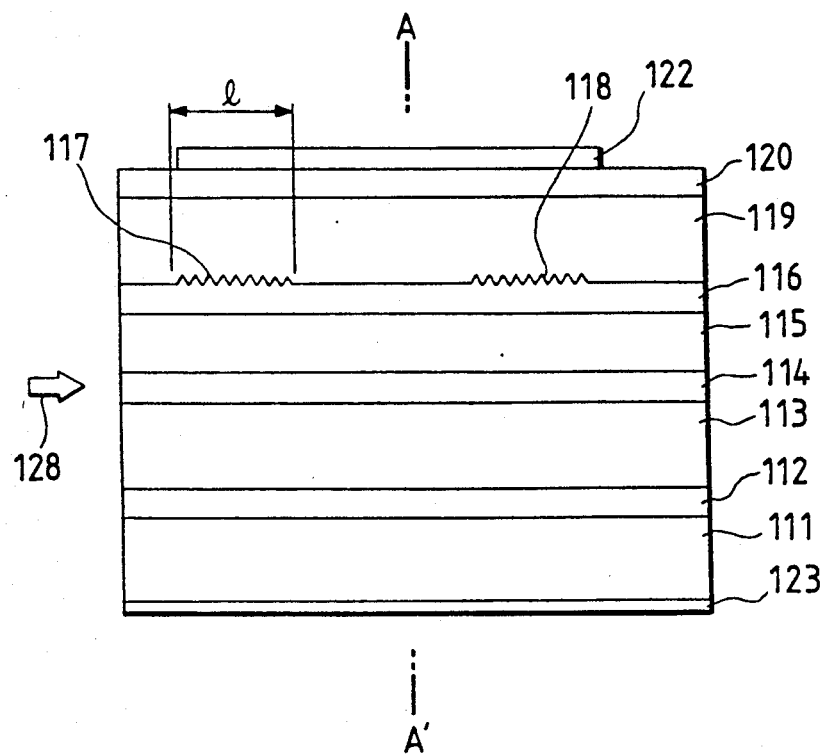
FIG. 19 is a cross-sectional side view showing the seventh example of an optical device according to this invention.
Figure 20:
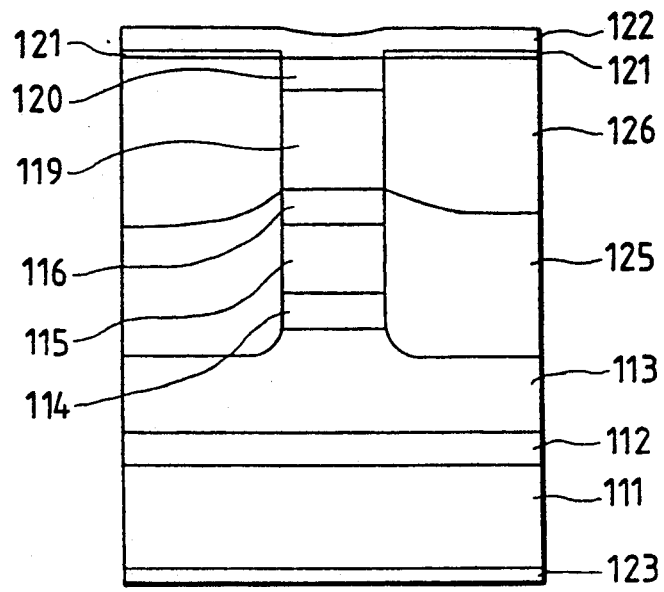
FIG. 20 is a cross-sectional front view showing the seventh example of an optical device according to this invention.

FIG. 19 is a view showing the construction of the seventh example according to this invention, and FIG. 20 is a cross-sectional view taken along line A—A'.

This example has grown in sequence, on the substrate 111 of n-GaAs, a buffer layer 112 consisting of n-GaAs, a first cladding layer 113 of thickness 1.5 μm consisting of n-Al$_{0.5}$Ga$_{0.5}$As, a guiding layer 114 of thickness 0.2 μm which is constructed a multiple quantum well (MQW) by laminating non-dope GaAs and Al$_{0.5}$Ga$_{0.5}$As alternately, a second cladding layer 115 consisting of n-Al$_{0.5}$Ga$_{0.5}$As, and an active layer 116 of thickness 0.4 μm which is made a multiple quantum well (MQW) by laminating non-dope GaAs and Al$_{0.4}$Ga$_{0.6}$As. For the crystal growth in this example, the metal organic chemical vapor deposition (MO-CVD method) was used, but the molecular beam epitaxial method (MBE method) can be used. The active layer 116 is formed, and then with photolithography, two gratings 117, 118 are formed in spaced portions on its upper surface so as to be appropriate for the wavelength of signal light for light amplification and to have the same selected wavelength. Then, a third cladding layer 119 of thickness 1.5 μm consisting of p-Al$_{0.5}$Ga$_{0.5}$As, a cap layer 120 of thickness 0.2 μm consisting of p$^+$-GaAs, and an insulative layer 121 are formed in sequence on the upper portion of this photocoupler, and further, a p-type electrode 122 is provided at the portion corresponding to the area between the grating 117 and 118 on the upper surface of the cap layer 120, and an n-type electrode 123 is provided on the back surface of the substrate 111. The liquid phase epitaxial method (LPE method) was used to make the third cladding layer 119 and the cap layer 120, but the CVD method can also be used.

Then, in order to make the waveguide 114 a three-dimensional structure, the both sides of the waveguide 114 are removed with the wet etching until the first cladding layer 113 is reached, as shown in FIG. 20, and a buried layer 125 consisting of p-Al$_{0.5}$Ga$_{0.5}$As and a buried layer 126 consisting of n-Al$_{0.5}$Ga$_{0.5}$As are grown in that removed area, with the LPE method, to form the buried structure.

In this example having two-layer waveguides (waveguide 114, active layer 116) as shown above, the incident light 128 comprising a plurality of laser lights having wavelengths ranging from 0.80 μm to 0.86 μm at intervals of 0.001 μm is coupled for input to the waveguide 114. In this example, in order to perform the wavelength filtering with light of 0.83 μm wavelength as the central wavelength, the ratio of ridge to groove changes, in accordance with the Blackman function distribution as shown in FIG. 11, along the progressive direction of light, with the pitch $\Lambda = 9$ μm from the expression (1) and the complete coupling length $L = 250$ μm from the expression (6).

The signal light transferred from the waveguide 114 to the active layer 116 by the grating 117, the coupling coefficient of which changes in the propagation direction of light, is amplified during propagation since the active layer 116 under the electrode 122 is a laser amplification section having a gain. The signal light amplified in propagating through the active layer 116 is coupled to the waveguide 114 again, with the grating 118 formed on the active layer 116, and output from the input/output waveguide 114, as previously described.

Thus, by injecting the current only between the grating 117 and the grating 118, the region of the active layer 116 (except for that interval) becomes an absorption waveguide, so that the signal input which is unnecessary for the amplified signal light is eliminated, and spontaneous emission light having a wavelength other than that of the amplified signal can also be removed. In this example, even if the region except for a portion between the gratings 117, 118 is removed with etching, the same effect can be obtained.

Figure 21:
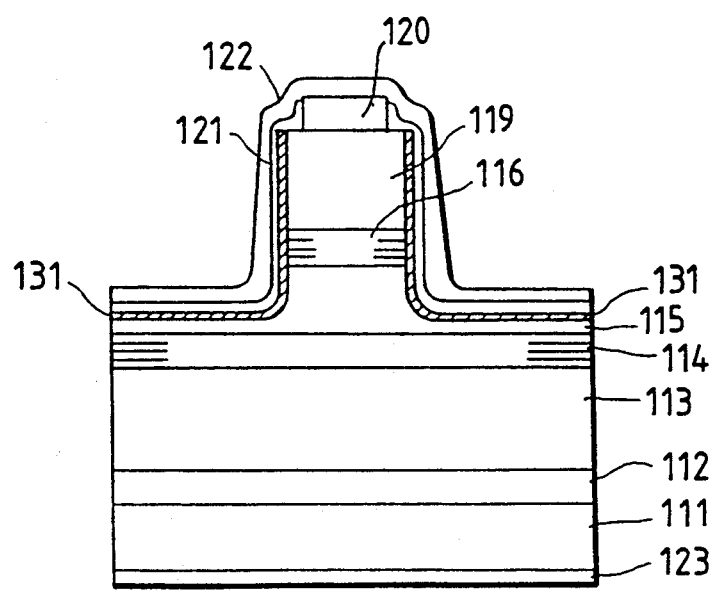
FIG. 21 is a cross-sectional front view showing the eighth example of an optical device according to this invention.
Figure 22:
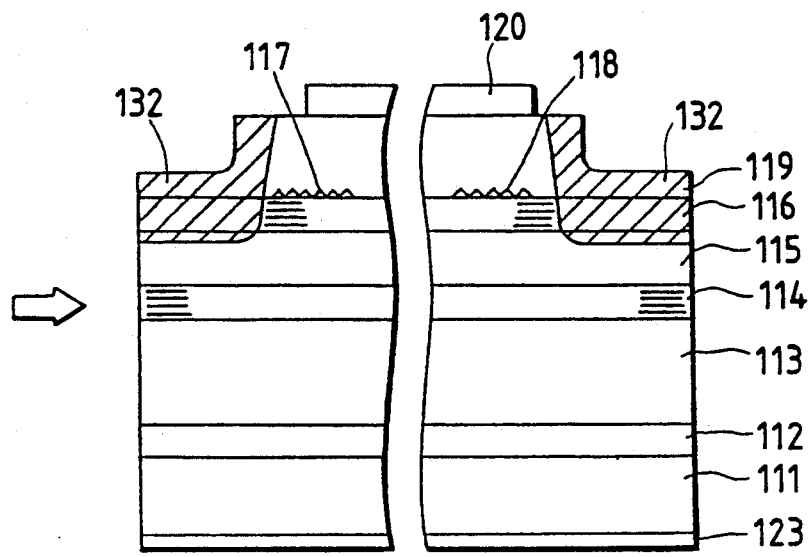
FIG. 22 is a cross-sectional side view showing the eighth example of an optical device according to this invention.

FIG. 21 and FIG. 22 are cross-sectional front and side views, respectively, showing the construction of the eighth example according to the invention. In this eighth example, the light confinement in the transverse direction, which was performed by the buried layers 125, 126 in the seventh example, is performed by removing both sides with etching. The construction of this example is nearly the same as that of the seventh example, wherein like reference numbers designate like parts.

In this example, a third cladding layer 119 is created, and then the three-dimensional waveguide 116 is formed as shown by etching both sides with the reactive ion etching method (RIBE of RIE method) until the second cladding layer 115 (or first cladding layer 113) is reached. An impurity diffusion layer 131 formed by applying the thermal diffusion of the p-type impurities, which is a conductive type opposite to that of the third cladding layer 119, on the etching end surface, and an impurity diffusion layer 132 is formed by applying the same thermal diffusion on the input/output end surface of the active layer 116, as shown in FIG. 22.

The impurity diffusion layers 131, 132 are intended to disorder both ends of the active layer 116 and the waveguide 114. The reason for this will be explained in the following. If a three-dimensional waveguide (as in this example) is formed, the injection carriers are recoupled via an interfacial level since a great number of interfacial levels exist on both end portions of the active layer 116. Consequently, invalid injection carriers increase, and the signal light transferred from the waveguide 114 is absorbed.

In this example, the super-lattice is disordered on a part of the active layer 116 and the waveguide 114, in the direction normal to the propagation direction of light, by the impurity diffusion layer 131, and the super-lattice is disordered on a part of the active layer 116 in the direction parallel to the propagation direction of light by the impurity diffusion layer 132. As a result, unnecessary light is not input into the active layer 116, and at the same time, the spontaneous emission light other than the wavelengths of signals that occur in the amplification region can be scattered, whereby the spontaneous emission light is prevented from emitting outside along with the amplified signal light.

In this way, this example allows the growth of the crystal to be made less than the seventh example, and to make a fine adjustment because the width of waveguide can be controlled by the time of thermal diffusion.

Figure 23:
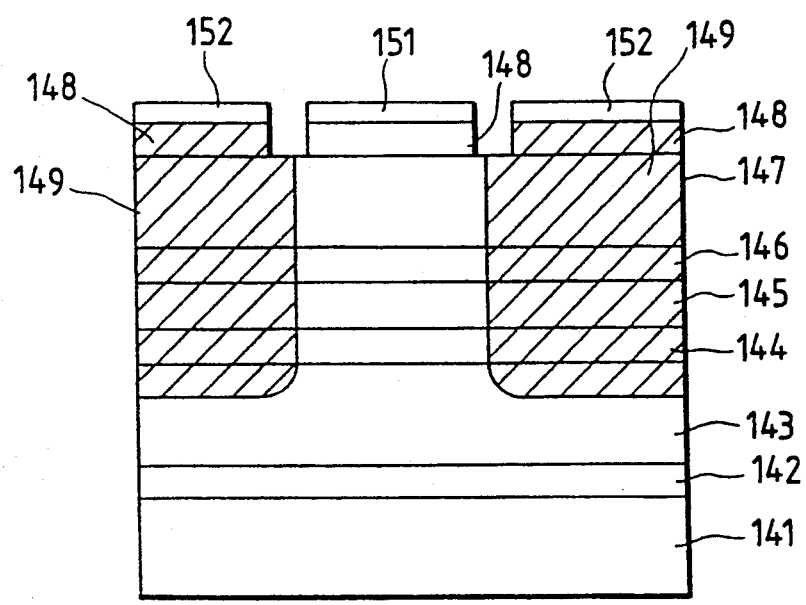
FIG. 23 is a cross-sectional side view showing the ninth example of an optical device according to this invention.

FIG. 23 is a view showing the construction of the ninth example according to this invention. This example has coated a substrate 141, a buffer layer 142, a first cladding layer 143, a waveguide 144, and a second cladding layer 145, all with GaAs and AlGaAs to which impurities are not doped, unlike the seventh and eighth examples. After coating, the grating (not shown) is formed on an active layer 146, and a n-type third cladding layer 147 and a cap layer 148 are regrown. Thereafter, a Si$_3$N$_4$ film is formed as a diffusion mask, and further, a stripe of about 6 μm width is formed by photolithography, and the n-GaAs cap layer 148 is etched selectively with an etching liquid consisting of aqueous ammonia and hydrogen peroxide. Then ZnAs and a sample are sealed in vacuum, heated at 650° C. for 2.5 hours, and placed in thermal diffusion on a portion where the cap layer 148 on both sides is formed, so that an impurity diffusion layer 149 is formed. The diffusion front at this time may reach to the first cladding layer 143, and both the waveguide 144 and the active layer 146 are disordered by Zn, so that the three-dimensional waveguide is formed. After that, a diffusion mask is removed, a p-type layer diffused on the cap layer 148 is removed by etching, and an insulative film (SiO$_2$) is formed after a p-type electrode 151 is formed. Further, on the insulative film a through hole is formed, with the photolithography, on which an n-type electrode 152 is formed.

The performance of the device in this example does not differ greatly from those of the seventh and eighth examples. However, this example offers more freedom in designing the devices and fabricating the optical integrated circuits, as non-doped layers are used up to the active layer 146.

In this way, the interval between waveguides can be set precisely by fabricating two waveguides (the active layer 146 and the waveguide 144) in the film direction during the growth of crystal. Also, since the grating is such that the ratio of ridge to groove changes along the progressive direction of light in accordance with the distribution of a specific function, the cross talk between the waveguide 144 to which the incident light is input and the active layer 146 can be reduced. As the design of crystal growth or grating is made easier, optimization of the device can be obtained. As described above, in the seventh to ninth examples, the input/output waveguide and the active layer were MQWs that were super-lattices, but an ordinary thin film waveguide is satisfactory as well. A structure in which the input/output waveguide is provided on the active layer is also possible.

In order to perform the optical amplification for a plurality of wavelengths, a plurality of pairs of gratings having a plurality of different periods and tapered to the intensity of coupling (each pair having a different selective wavelength) can be provided.

As described above, when the grating is formed by the corrugation, it is sufficient that the depth of the groove (low refractive index region) is increased if the coupling length is required to be shorter. However, if the depth of groove is deepened, the effective layer thickness (mean value of layer thicknesses) for the waveguide formed with the grating, for example, the second waveguide 6 as shown in FIG. 4, changes largely together with the change of the duty ratio. The change of this effective layer thickness has an effect on the selectiveness of wavelength for the guided light. An example according to this invention which further improves the above mentioned inconvenience will be explained in the following.

In the following example, the duty ratio of the grating (the ratio of a high refractive index region to a low refractive index region in one cycle of the grating) is changed in the propagation direction of light, and one pitch (length of one cycle) of the grating is also gradually changed in the propagation direction of light. Thereby the change of the effective layer thickness in the waveguide where the grating is formed can be minimized and an optical device that allows the effective filtering of a desired light can be obtained.

Figure 24:
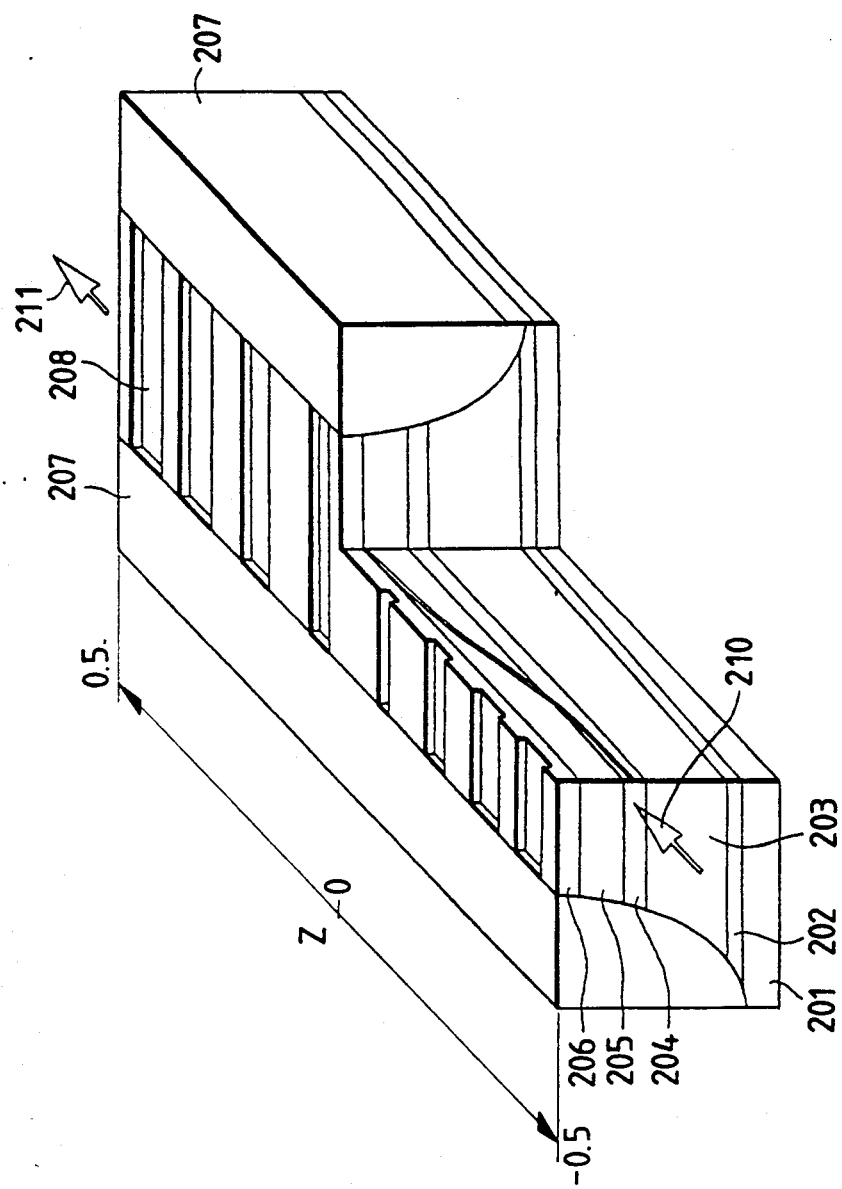
FIG. 24 is a partial cross-sectional perspective view showing the tenth example of an optical device according to this invention.

FIG. 24 is a partial cross-sectional perspective view showing the tenth example according to this invention. In the same figure, this example has grown in sequence with the molecular beam epitaxy (MBE) method, on the substrate 201 of GaAs, a buffer layer 202 of thickness 0.5 μm consisting of GaAs, a cladding layer 203 of thickness 1.5 μm consisting of Al$_{0.5}$Ga$_{0.5}$As, a first waveguide 204 which is made a multiple quantum well (MQW) by laminating each of nine GaAs layers (30Å) and Al$_{0.5}$Ga$_{0.5}$As layers alternately a cladding layer 205 of thickness 0.8 μm consisting of Al$_{0.5}$Ga$_{0.5}$As, and a second waveguide 206 consisting of a multiple quantum well (MQW) constructed by laminating 55 GaAs layers (30Å) and Al$_{0.4}$Ga$_{0.6}$As layers (60Å), alternately, and the Al$_{0.4}$Ga$_{0.5}$As layer (300Å) on the upper portion of MQW.

Then using a photoresist, a stripe of 12 μm in depth is formed, a wafer is etched in a stripe-like form up to the GaAs buffer layer, with an etching liquid containing a mixture of sulfuric acid, hydrogen peroxide and water. After removing the photoresist, the Al$_{0.4}$Ga$_{0.5}$As layer 207 is regrown with the liquid phase growth, and the stripe is embedded. In this case, as an upper portion of the stripe is the Al$_{0.4}$Ga$_{0.6}$As layer (uppermost layer of the second waveguide 206), the Al$_{0.5}$Ga$_{0.5}$As is not regrown.

Subsequently, the grating is formed in the direction orthogonal to the above mentioned stripe, using a photoresist. Also, using an etching liquid containing a mixture of sulfuric acid, hydrogen peroxide and water, the second waveguide 206 is etched partially, and the grating consisting of corrugation of 700Å in depth is formed. Thereafter, with the sputtering method, SiO$_2$ is coated on the grating 208. The back surface of wafer is wrapped so that the thickness of wafer may be made 100 μm. Furthermore, this wafer is cut to a predetermined size, and $ZrO_2$ is deposited on the input/output end face of cut water to make an unreflective coating. Thus the structure with two waveguides 204, 206 laminated as shown in FIG. 24 can be obtained.

In this example, in order to suppress the side lobe filter characteristic, the coupling coefficient of the grating 208 is gradually changed over the coupling area. The distribution of the coupling coefficient changes stepwise depending on the position within the coupling area (shown with a value z normalized by the complete coupling length), as shown with a bold solid line in FIG. 25. The modified embodiment is constructed almost symmetrically along the traveling direction of light from the central portion toward the input and output sides of light. A fine line in FIG. 25 indicates the coupling coefficient of the Hamming function $F(z) = 1 + 0.852 \cdot \cos(2\pi z/L)$. The stepwise coupling coefficient of the bold line almost approximates the fine line and can provide in practice the same effect as the Hamming function for the distribution of the coupling coefficient.

Such a distribution of the coupling coefficient can be obtained by appropriately distributing the duty ratio (ratio $t/\Lambda$ occupied by the ridge width t in a pitch $\Lambda$) and the pitch $\Lambda$ of the grating 208 for a specific selected wavelength (in the following explanation, $\lambda_0 = 0.83$ μm).

Figure 26:
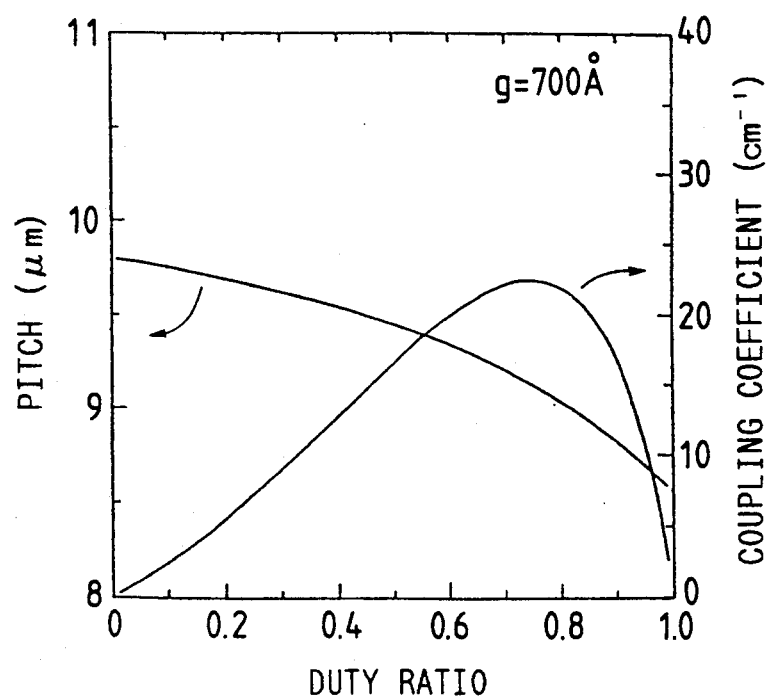
FIG. 26 is a view showing the relations between the duty ratio the pitch and the coupling coefficient in the tenth example.

FIG. 26 shows the pitch and the coupling coefficient to the duty ratio $t/\Lambda$ of the grating, when the specific selected wavelength $\lambda_0$ is selected. The pitch tends to be smaller if the duty ratio is greater, while the coupling coefficient is at maximum near the duty ratio of 0.8. This is explained in the following way. If the duty ratio is increased, the growth width (portion of groove) of the grating is narrowed, so that the effective thickness of the second waveguide 206 is thicker, and the value of the propagation constant $\beta_{even}$ for the even mode of light propagating through the second waveguide 6 is greater. Assuming the propagation constant for the odd mode of light propagating through the first waveguide 4 to be $\beta_{odd}$, the pitch $\Lambda$ of the grating 208 for realizing the phase matching between the even mode and the odd mode can be given by the following expression.

$$\Lambda = 2\pi/(\beta_{even} - \beta_{odd}) \quad (9)$$

Therefore, if $\beta_{even}$ is greater, the pitch $\Lambda$ is smaller.

Figure 25:
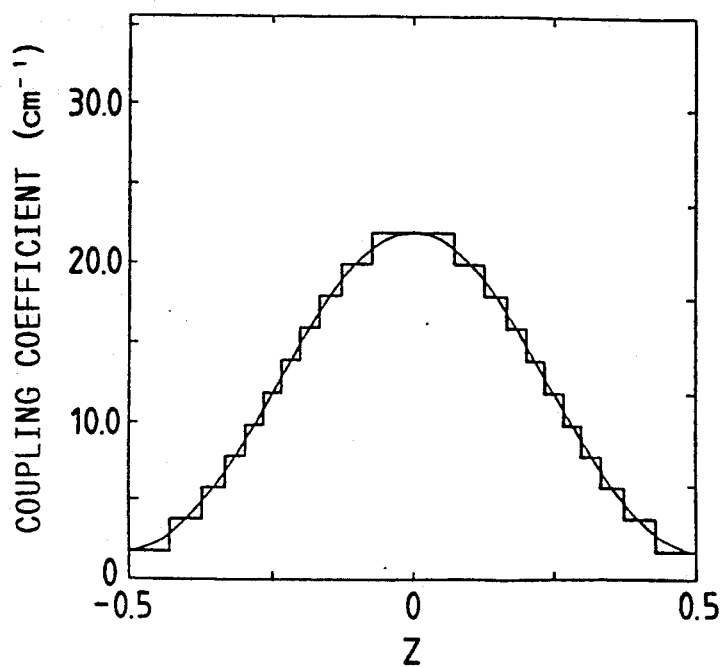
FIG. 25 is a view showing the distribution of coupling coefficient in the propagation direction of light in the tenth example.
Figure 27:
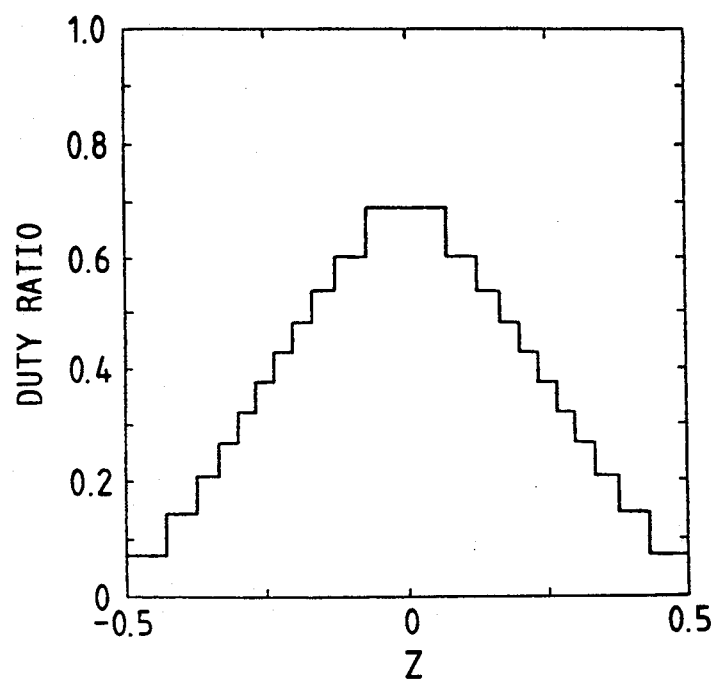
FIG. 27 is a view showing the change of the duty ratio in the propagation direction of light in the tenth example.
Figure 28:
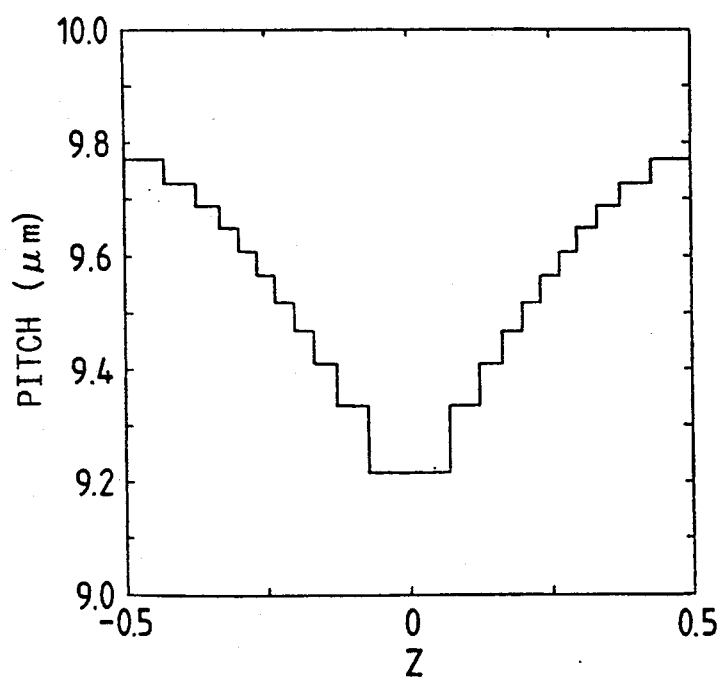
FIG. 28 is a view showing the change of the grating pitch in the propagation direction of light in the tenth example.

In order to obtain the distribution of the coupling coefficient as shown in FIG. 25, a combination of the duty ratio and the pitch at which a desired coupling coefficient can be obtained at each point of the coupling area is selected from FIG. 24. As a result of such a selection, the duty ratio changes over the entire coupling area, as shown in FIG. 27, to establish the distribution of the coupling coefficient of FIG. 25. The pitch is distributed over the entire coupling area, as shown in FIG. 28.

Figure 29:
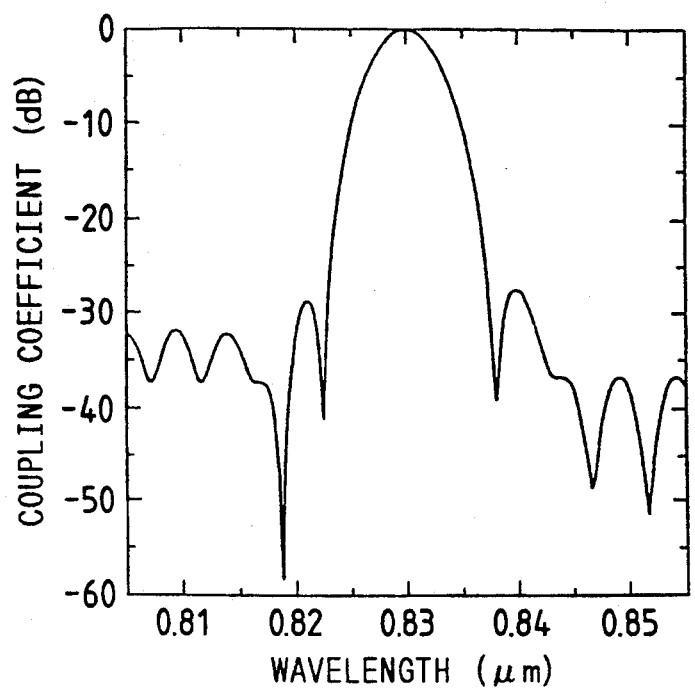
FIG. 29 is a view showing the characteristic of the band-pass filter in the tenth example.

FIG. 29 shows the result of measuring the output light intensity (or the coupling efficiency where the ratio of the intensity of the incoming light at each wavelength to that of the outgoing light is expressed in dB units) from the second waveguide 206, after introducing the light from a tunable light source into the first waveguide 204 of the optical wavelength filter. Thereby it can be seen that the optical wavelength filter of this example has a sufficiently suppressed side lobe, and has low cross talk between wavelengths.

Figure 30:
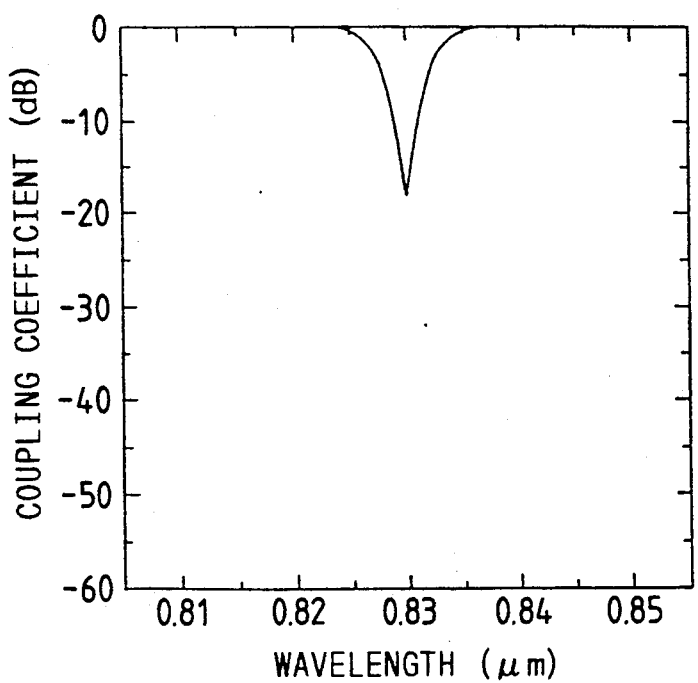
FIG. 30 is a view showing the characteristic of the notch filter in the tenth example.

On the other hand, FIG. 30 shows the intensity of output light from the first waveguide 204, indicating the notch filter characteristic in which the light does not transmit only at the central wavelength $\lambda_0$.

Figure 31:
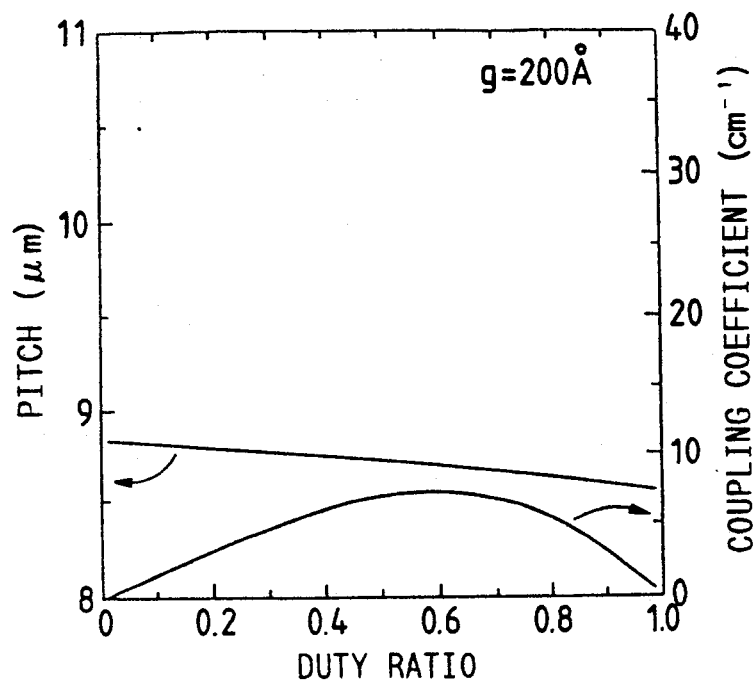
FIGS. 31 and 32 are views showing other examples of the relations between the duty ratio of grating, the pitch and the coupling coefficient.

Also, the depth of the grating was 700Å in this example, but when the grating depth is 200Å, for example, the pitch to the duty ratio is almost constant as shown in FIG. 31. Therefore, even though the duty ratio is distributed functionally, the coupling coefficient can be distributed as shown in FIG. 25, to obtain an excellent filter characteristic.

Figure 32:
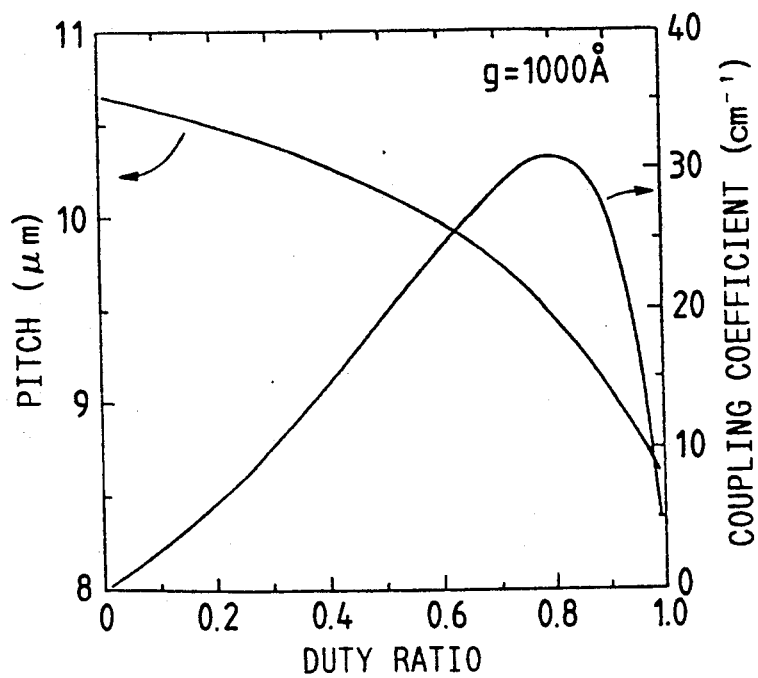

On the contrary, FIG. 32 shows a case where the grating depth is deeper such as 1000Å. As seen, if the grating depth is increased, the pitch must be distributed in a tapering manner to obtain an excellent filter characteristic.

In this way, it should be understood that the distribution of pitch must be considered for a grating depth of 700Å, while it does not have to be a primary consideration for the grating depth of 200Å, in the example as shown in FIG. 24. But an appropriate grating depth largely depends on the layer thicknesses or refractive indices for the waveguides and the cladding layers constituting the filter. Therefore, in the construction of an optical device, the duty ratio and the distribution of pitch must be determined so as to attain an excellent filter characteristic corresponding to the grating depth.

On the contrary, when the pitch is to be changed, an excellent filter characteristic can be obtained, as shown in FIG. 25, by appropriately selecting the distribution of the pitch and the duty ratio, even though the grating depth is increased to shorten the coupling length.

Figure 33:
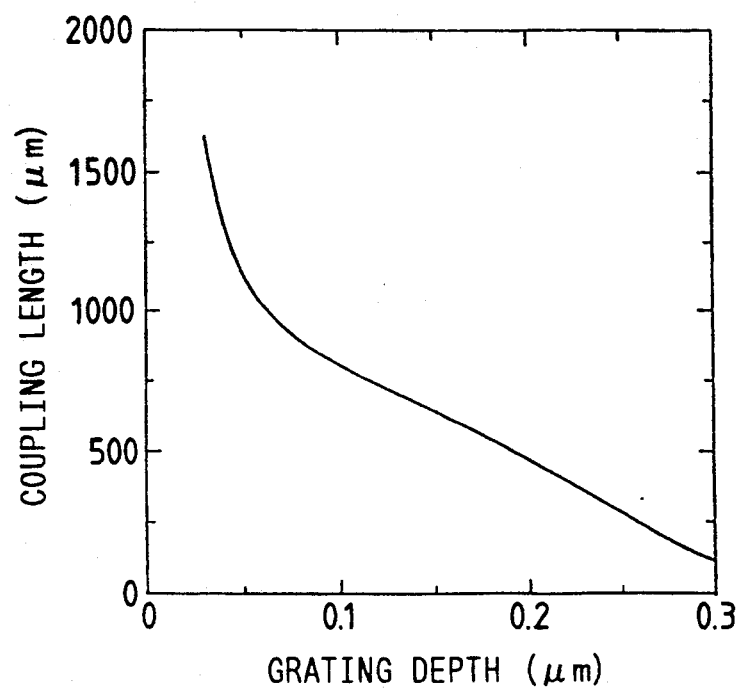
FIG. 33 is a view showing the relation between the grating depth and the coupling length.

FIG. 33 shows how the coupling length changes when the grating depth is changed. It will be seen that if the grating depth is larger, the coupling coefficient on the coupling area becomes larger, and the coupling length (the length of waveguide required to completely transfer the optical power between waveguides) becomes shorter. As short coupling length is an important factor for integration, the grating depth must be increased if required. According to this invention, even when the grating depth is large, the side lobes can be effectively suppressed by making the distribution of pitch taper-shaped.

Here the operation of the example shown in FIG. 24 is described. The incident light 210 multiplexed in wavelengths ranging from 0.80 μm to 0.86 μm is coupled for input to the first waveguide 204 of this example. There are two guided modes which stand in two waveguides 204, 206, i.e., the even mode and the odd mode. The incident light 210 to the first waveguide 204 propagates in the odd mode on the first waveguide 204 as the central portion. Then as the odd mode and the even mode have different propagation constants, the light propagates almost without coupling in the region where the grating 208 does not exist. However, in the region where the grating 208 exists, the transfer of optic power of wavelength $\lambda$ occurs if the above expression (9) is satisfied between the propagation constant $\beta_{odd}(\lambda)$ for the odd mode and the propagation constant $\beta_{even}(\lambda)$ for the even mode.

If the transfer of optic power occurs, the guided light in the odd mode to which the incident light 210 is coupled can be converted into the guided light in the even mode. Accordingly, the incident light 210 finally becomes the optical wave propagating through the second waveguide 206, and is output as the selected output light 211. The light containing other wavelengths is output from the first waveguide 204 as the unselected output light.

Figure 34:
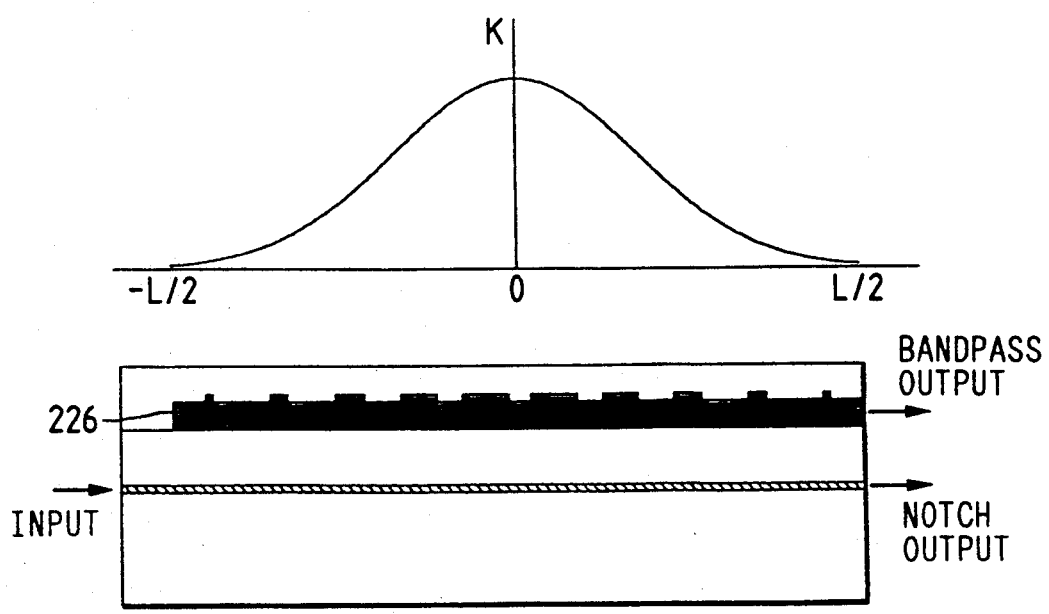
FIG. 34 is a cross-sectional side view showing the eleventh example of an optical device according to this invention, and a view showing the change of the coupling coefficient.
Figure 35:
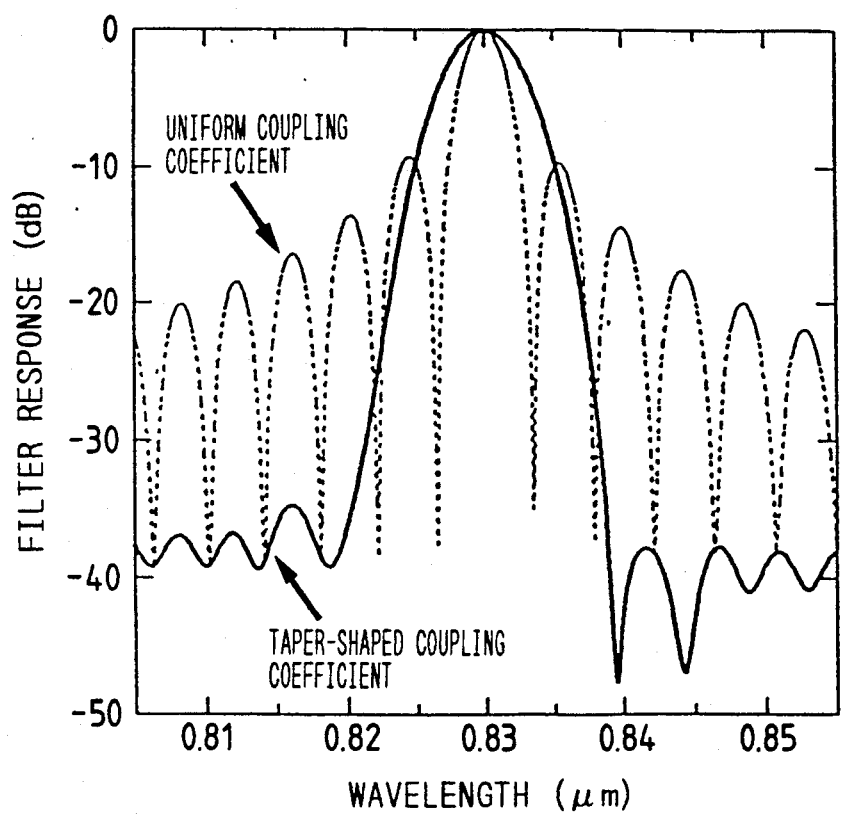
FIG. 35 is a view showing the characteristic of the band-pass filter in the eleventh example.

FIG. 34 shows a schematic view of the eleventh example according to this invention, when the distribution of the coupling coefficient κ is a Gaussian distribution. The present example is an optical wavelength filter that was created by the same process as the tenth example. The result of measuring the transmitted spectrum from the second waveguide 206 according to this example is shown as a solid line in FIG. 35. Compared with a case of uniform coupling coefficient distribution (indicated with a dashed line), the side lobe is suppressed by 20-25 dB. The cross talk between the central wavelength ($\lambda = 0.83$ μm) and the wavelength 100Å off that central wavelength exceeded $-35$ dB. In FIG. 35, the dashed line indicates the filter response of a comparative example when the coupling coefficient is uniform over the entire coupling area.

The examples shown in FIG. 34 and FIG. 35 can be applied to a noise filter integrated with an optical amplifier using a laser structure, an integrated internal filter of an external resonator type laser, or a filter integral with an optical filter. These examples can be formed of III-V group compound semiconductor except for GaAs group, or II-VI group compound semiconductor such as CdTe, or $SiO_2$, $Si_3N_4$, $LiNbO_3$.

We claim:

1. An optical device comprising:
   a substrate;
   a first guiding layer provided on said substrate;
   a second guiding layer laminated with said first guiding layer on said substrate, said second guiding layer having a guided mode different from that of said first guiding layer; and
   a diffraction grating provided on an area in which said first and second guiding layers have their guided modes overlapping, said diffraction grating serving to couple the light on the specific range of wavelengths that propagates through said first guiding layer, with said second guiding layer,
   wherein said diffraction grating comprises a high refractive index region and a low refractive index region disposed periodically in the propagation direction of light, the ratio of the high refractive index region to the low refractive index region occupied in one period changing gradually in the propagation direction of light.

2. An optical device according to claim 1, wherein said diffraction grating is formed such that the coupling coefficient between the first guiding layer and the second guiding layer is high in the central portion of the diffraction grating in the propagation direction of light, and is low on both end portions of the diffraction grating.

3. An optical device according to claim 2, wherein said diffraction grating is formed such that the coupling coefficient between the first guiding layer and the second guiding layer is symmetrically distributed with respect to the central portion of the diffraction grating in the propagation direction of light.

4. An optical device according to claim 2, wherein said diffraction grating is formed such that the ratio of the high refractive index region to the low refractive index region occupied one period is high in the central portion of the diffraction grating in the propagation direction of light, and is low on both end portions of the diffraction grating.

5. An optical device according to claim 4, wherein said diffraction grating consisting of a corrugation formed on the second guiding layer, and is formed such that the ratio of a ridge portion of the corrugation to a groove portion of the corrugation occupied in one period is high in the central portion of the diffraction grating int eh propagation direction of light, and is low on both end portions of the diffraction grating.

6. An optical device according to claim 2, wherein when the complete coupling length between the first guiding layer and the second guiding layer is L, the progressive direction of light to be the z direction, the coupling coefficient which changes in the z direction to be G(z), a taper function for the coupling coefficient distribution G(z) to be F(z), and $G_0$ to be a constant, the following relation is satisfied;

$$\int_{-L/2}^{L/2} G(z)dz = \pi/2$$

$$G(z) = G_0 \cdot F(z)$$

$$\int_{-L/2}^{L/2} F(z)dz = L.$$

7. An optical device according to claim 6, wherein said taper function F(z) is a Hamming function as expressed in the following:

$$F(z) = 1 + 0.852 \cdot \cos(2\pi z/L)$$

8. An optical device according to claim 6, wherein said taper function is a Blackman function as expressed in the following:

$$F(z) = 1 + 1.19 \cos(2\pi z/L) + 1.19 \cos(4\pi z/L)$$

9. An optical device according to claim 6, wherein said taper function is a raised cosine function as expressed in the following:

$$F(z) = 1 + \cos(2\pi z/L)$$

10. An optical device according to claim 6, wherein said taper function is a Kaiser function as expressed in the following:

$$F(z) = [\gamma/\sinh(\gamma)]I_0(\gamma\{1-(2z/L)^2\}^{\frac{1}{2}})$$

where $\gamma$ is an arbitrary number, and $I_0$ is the zero order value of the Bessel function of the first kind.

11. An optical device according to claim 1, wherein, when the wavelength of said propagating light is $\lambda$, the propagation constant n the guided mode for the first guiding layer is $\beta_0(\lambda)$, the propagation constant in the guided mode for the second guiding layer is $\beta_1(\lambda)$, and the pitch of the diffraction grating is $\Lambda$, the following expression is satisfied, $$\beta_1(\lambda) - \beta_0(\lambda) = 2\pi/\Lambda$$

12. An optical device according to claim 1, further comprising first, second, and third cladding layers, wherein said first cladding layer, said first guiding layer, said second cladding layer, said second guiding layer, and said third cladding layer are sequentially laminated on said substrate.

13. An optical device according to claim 7, wherein said substrate and each of said layers consist of GaAs or AlGaAs.

14. An optical device according to claim 13, wherein said first and second guiding layers have multiple quantum wells.

15. An optical device according to claim 1, further comprising a light absorption layer for absorbing at least a part of the light coupled with the second guiding layer and an electrode for converting the light absorbed in said light absorption layer into an electrical signal to be outputted therefrom.

16. An optical device according to claim 15, wherein said light absorption layer is arranged in series with the second guiding layer with respect to the light propagation direction.

17. An optical device according to claim 15, further comprising an n-type semiconductor layer and a p-type semiconductor layer which sandwich the light absorption layer therebetween, and wherein said light absorption layer comprises an i-type semiconductor layer.

18. An optical device according to claim 1, wherein said second guiding layer absorbs the light coupled with said second guiding layer by the diffraction grating, and said device further comprises an electrode for converting the light absorbed in the second guiding layer into an electrical signal to be outputted therefrom.

19. An optical device according to claim 18, further comprising first, second and third cladding layers, and wherein the first cladding layer, first guiding layer, second cladding layer, second guiding layer and third cladding layer are sequentially laminated on said substrate.

20. An optical device according to claim 19, wherein each of said first guiding layer, first and second cladding layers comprise a semiconductor having a first conductive type, said third cladding layer comprises a semiconductor having a second conductive type, and said second guiding layer comprises an i-type semiconductor.

21. An optical device according to claim 20, wherein said first conductive type is an n-type and said second conductive type is a p-type.

22. An optical device according to claim 19, wherein said substrate comprises a semi-insulating semiconductor, said first and second guiding layers, said first, second and third cladding layers respectively comprise i-type semiconductors, and wherein a stripe-like region extending in the light propagation direction is formed in a part of the lamination of the substrate, first and second guiding layers, the first, second and third cladding layers, and a p-type region and an n-type region are provided on both sides of said stripe-like region.

23. An optical device according to claim 19, further comprising a source electrode and drain electrode which contact with said p-type region and n-type region, respectively, an insulating layer formed on said third cladding layer of the stripe-like region, and a gate electrode provided on said insulating layer.

24. An optical device according to claim 1, further comprising a laser active region provided on at least a part of said second guiding layer and an electrode for supplying a current to said laser active region, and wherein said laser active region amplifies the light propagating through said second guiding layer by supplying the current thereinto.

25. An optical device according to claim 24, wherein said diffraction grating comprises a first diffraction grating and a second diffraction grating which are separately provided at a predetermined interval in the light propagation direction, and wherein the light propagating through said first guiding layer is coupled with said second guiding layer by said first diffraction grating and the light coupled and propagated in said second guiding layer is coupled with said first guiding layer again by said second diffraction grating.

26. An optical device according to claim 25, wherein an impurity is diffused in a portion of said second guiding layer other than a region between said first and second diffraction gratings.

27. An optical device according to claim 24, further comprising a first, second and third cladding layers, and wherein said first cladding layer, first guiding layer, second cladding layer, second guiding layer and third cladding layer are sequentially laminated on said substrate.

28. An optical device according to claim 27, wherein said first cladding layer, first guiding layer, second cladding layer, second guiding layer, and third cladding layer are mesa-etched except for said stripe-like region extending in the light propagation direction, and an embedded layer is formed on both sides of the mesa region.

29. An optical device according to claim 27, wherein a stripe-like ridge extending in the light propagation direction is formed on said second cladding layer, second guiding layer and third cladding layer by etching.

30. An optical device comprising:
   a substrate;
   a first guiding layer provided on said substrate and having a guided mode;
   a second guiding layer laminated with said first guiding layer on said substrate, said second guiding layer having a guided mode different from the guided mode of said first guiding layer; and
   a diffraction grating provided on an area in which said first and second guiding layers have their guided modes overlapping, said diffraction grating serving to couple the light in the specific range of wavelengths that propagate through said first guiding layer, with said second guiding layer,
   wherein said diffraction grating comprises a high refractive index region and a low refractive index region disposed periodically in the propagation direction of light, the ratio of the high refractive index region to the low refractive index region changing gradually in the propagation direction of light, and the pitch of said diffraction grating gradually changing in the propagation direction of light.

31. An optical device according to claim 30, wherein said diffraction grating is formed such that the coupling coefficient between the first guiding layer and the second guiding layer is high in the central portion of the diffraction grating in the propagation direction of light, and is low on both end portions of the diffraction grating.

32. An optical device according to claim 31, wherein said diffraction grating is formed such that the coupling coefficient between the first guiding layer and the second guiding layer is symmetrically distributed with respect to the central portion of the diffraction grating in the propagation direction of light.

33. An optical device according to claim 31, wherein said diffraction grating is formed such that the ratio of the high refractive index region to the low refractive index region occupied in one period is high in the central portion of the diffraction grating in the propagation direction of light, and is low on both end portions of the diffraction grating.

34. An optical device according to claim 33, wherein said diffraction grating consists of a corrugation formed on the second guiding layer, and is formed such that the ratio of the ridge portion of the corrugation to a groove portion of the corrugation occupied in one period is high in the central portion of the diffraction grating in the propagation direct on of light, and low on both end portions of the diffraction grating.

35. An optical device according to claim 30, wherein when the wavelength of said propagating light is $\lambda$, the propagation constant in the guided mode for the first guiding layer is $\beta_0(\lambda)$, the propagation constant in the guided mode for the second guiding layer is $\beta_1(\lambda)$, and the pitch of the diffraction grating is $\Lambda$, the following expression is satisfied, $$\beta_1(\lambda) - \beta_0(\lambda) = 2\pi/79$$

36. An optical device according to claim 30, further comprising first, second, and third cladding layers, wherein said first cladding layer, said first guiding layer, said second cladding layer, said second guiding layer, and said third cladding layer are sequentially laminated on said substrate.

37. An optical device according to claim 30, wherein said substrate and each of said layers consist of GaAs for AlGaAs.

38. An optical device according to claim 37, wherein said first and second guiding layers have multiple quantum wells.

39. An optical device according to claim 31, wherein the following relations are satisfied:

$$\int_{-L/2}^{L/2} G(z)dz = \pi/2,$$

$$G(z) = G_0 \cdot F(z), \text{ and}$$

$$\int_{-L/2}^{L/2} F(z)dz = L,$$

where L is the complete coupling length between the first guiding layer and the second guiding layer, G(z) is the coupling coefficient of light in the z direction, F(z) is the taper function for distributing the coupling coefficient G(z), and $G_0$ is a constant.

40. An optical device according to claim 39, wherein said coupling coefficient has a distribution approximating a Hamming function F(z) as expressed in the following, in the propagation direction of light, i.e., the z direction, $$F(z) = 1 + 0.852 \cdot \cos(2\pi Z/l),$$

where L is the complete coupling length between the first guiding layer and the second guiding layer.

* * * * *

UNITED STATES PATENT AND TRADEMARK OFFICE
CERTIFICATE OF CORRECTION

PATENT NO.   : 5,333,216
DATED        : July 26, 1994                Page 1 of 4
INVENTOR(S)  : HAJIME SAKATA, ET AL.

It is certified that error appears in the above-indentified patent and that said Letters Patent is hereby corrected as shown below:

ON THE COVER PAGE:

[54] In the Title,

"OPTICAL DEVICE USED WAVELENGTH SELECTIVE PHOTOCOUPLER" should read --OPTICAL DEVICE USING WAVELENGTH SELECTIVE PHOTOCOUPLER--.

[56] In the References Cited,

U.S. PATENT DOCUMENTS, before

"5,101,469    3/1992  Oda ................ 385/131"
insert the following:

```
--3,970,958    7/1976   Streifer et al. ..  385/28X
  3,970,959    7/1976   Wang et al. ......  385/28X
  4,067,641    1/1978   Holton ...........  385/131
  4,747,649    5/1988   Heinen et al. ....  385/130X
  4,755,015    7/1988   Uno et al. .......  385/131
  4,861,128    8/1989   Ishikawa et al. ..  385/131X
  4,881,791   11/1989   Mallinson et al. .  385/130X--.
```

COLUMN 1, line 2, "USED" should read --USING--.

UNITED STATES PATENT AND TRADEMARK OFFICE
CERTIFICATE OF CORRECTION

PATENT NO. : 5,333,216
DATED : July 26, 1994         Page 2 of 4
INVENTOR(S) : HAJIME SAKATA, ET AL.

It is certified that error appears in the above-indentified patent and that said Letters Patent is hereby corrected as shown below:

COLUMN 2, line 48, "view showing" should be deleted.

COLUMN 3, line 39, "ratio" should read --ratio,--.

COLUMN 4, line 4, "GaAS" should read --GaAs--; and
line 36, "endbed" should read --embed--.

COLUMN 5, line 42, "for $x<0$ or $w<x$" should read
-- for $x<0$ or $w<x$ ....... (3) --.

COLUMN 6, line 5, "form" should read --from--;

line 15, "$\int_{-L/2}^{L/2} G(z)dz = \pi/2$" should read
--$\int_{-L/2}^{L/2} G(z)dz = \pi/2$ ....... (4) --; and line 29, "$\int_{-L/2}^{L/2} F(z)dz = L$" should read
--$\int_{-L/2}^{L/2} F(z)dz = L$ ....... (6) --.

UNITED STATES PATENT AND TRADEMARK OFFICE
CERTIFICATE OF CORRECTION

PATENT NO. : 5,333,216
DATED : July 26, 1994
INVENTOR(S) : HAJIME SAKATA, ET AL.

It is certified that error appears in the above-indentified patent and that said Letters Patent is hereby corrected as shown below:

COLUMN 9, line 61, "layer 56" should read --layer 56.--.

COLUMN 11, line 11, "(dopening" should read --(doping--.

COLUMN 14, line 45, "layers alternately" should read --layers, alternately--.

COLUMN 18, line 9, "int eh" should read --in the--; and
line 57, "n" should read --in--.

COLUMN 20, line 16, "a" should be deleted.

COLUMN 21, line 11, "the ridge" should read --a ridge--;
line 15, "direct on" should read --direction--, and "low" should read --is low--; and
line 25, "$\beta_1(\lambda) - \beta_0(\lambda) = 2\pi/79$" should read --$\beta_1(\lambda) - \beta_0(\lambda) = 2\pi/\Lambda$--.

UNITED STATES PATENT AND TRADEMARK OFFICE
CERTIFICATE OF CORRECTION

PATENT NO. : 5,333,216
DATED : July 26, 1994  Page 4 of 4
INVENTOR(S) : HAJIME SAKATA, ET AL.

It is certified that error appears in the above-indentified patent and that said Letters Patent is hereby corrected as shown below:

<u>COLUMN 22,</u> line 3, "for" should read --or--.

Signed and Sealed this

Twenty-third Day of May, 1995

Attest:

BRUCE LEHMAN

Attesting Officer    Commissioner of Patents and Trademarks